United States Patent [19]
Saxelby, Jr. et al.

[11] Patent Number: 5,728,600
[45] Date of Patent: Mar. 17, 1998

[54] CIRCUIT ENCAPSULATION PROCESS

[75] Inventors: John R. Saxelby, Jr., Maynard; Walter R. Hedlund, III, Lowell, both of Mass.

[73] Assignee: VLT Corporation, San Antonio, Tex.

[21] Appl. No.: 340,162

[22] Filed: Nov. 15, 1994

[51] Int. Cl.⁶ .......................... H01L 21/56; H01L 21/58; H01L 21/603
[52] U.S. Cl. .......................... 437/207; 437/212; 437/214; 437/216; 437/219; 264/272.17
[58] Field of Search .......................... 437/205, 207, 437/211, 212, 214, 216, 219; 264/272.17, 276; 425/116, 117, 125, 127; 249/84, 85, 95, 96; 29/841, 856, 858

[56] References Cited

U.S. PATENT DOCUMENTS

| | | | |
|---|---|---|---|
| 2,669,753 | 2/1954 | Hormann | 18/59 |
| 2,724,864 | 11/1955 | Krotz | 18/42 |
| 2,937,409 | 5/1960 | Cole | 18/59 |
| 3,238,287 | 3/1966 | Chapman | 264/276 |
| 3,354,529 | 11/1967 | James | 29/156.8 |
| 3,408,438 | 10/1968 | Staunton | 264/252 |
| 3,539,675 | 11/1970 | Hugill | 264/157 |
| 3,621,338 | 11/1971 | Rogers et al. | |
| 3,683,241 | 8/1972 | Duncan | |
| 3,737,729 | 6/1973 | Carney | |
| 3,769,702 | 11/1973 | Scarbrough | |
| 4,029,388 | 6/1977 | Knoll | 339/218 |
| 4,218,724 | 8/1980 | Kaufman | |
| 4,336,009 | 6/1982 | Wolf | 425/116 |
| 4,400,762 | 8/1983 | Bartley et al. | |
| 4,528,749 | 7/1985 | Heft | 29/858 |
| 4,551,746 | 11/1985 | Gilbert et al. | |
| 4,551,747 | 11/1985 | Gilbert et al. | |
| 4,554,613 | 11/1985 | Kaufman | |
| 4,688,152 | 8/1987 | Chia | 361/408 |
| 4,691,265 | 9/1987 | Calver et al. | |
| 4,724,283 | 2/1988 | Shimada et al. | |
| 4,724,514 | 2/1988 | Kaufman | |
| 4,736,520 | 4/1988 | Morris | |
| 4,740,414 | 4/1988 | Shaheen | |
| 4,750,089 | 6/1988 | Derryberry et al. | |
| 4,750,092 | 6/1988 | Werther | |
| 4,769,525 | 9/1988 | Leatham | |

(List continued on next page.)

FOREIGN PATENT DOCUMENTS

| | | | |
|---|---|---|---|
| 53-124075 | 10/1978 | Japan | 264/272.17 |
| 55-118640 | 9/1980 | Japan | 264/272.17 |
| 60-76130 | 4/1985 | Japan | 437/211 |
| 61-193460 | 8/1986 | Japan | 437/219 |
| 63-32622 | 2/1987 | Japan | 437/207 |
| 62-193131 | 8/1987 | Japan | 149/95 |
| 63-172433 | 7/1988 | Japan | 264/272.17 |
| 4-23442 | 1/1992 | Japan | 29/856 |

OTHER PUBLICATIONS

Finnemore et al., Application Ser. No. 08/157,936, Nov. 24, 1993.
Vinciarelli et al., Application Ser. No. 08/337,269, Nov. 10, 1994.
Electronic Products, "Ball grid array package challenges quad flatpack", p.19, Apr. 1993.

*Primary Examiner*—David Graybill
*Attorney, Agent, or Firm*—Fish & Richardson P.C.

[57] ABSTRACT

A method for encapsulating portions of a circuit formed on a substrate. The substrate has two faces and perimeter sides. Encapsulating surrounds, in molding compound, a portion of one of the faces of the substrate and a portion of the sides of the substrate, and during encapsulation a portion of the one face of the substrate that bears conductive pads is left unencapsulated.

An encapsulated circuit including a substrate having two faces and perimeter sides around the faces and a circuit formed on the substrate. The substrate also includes conductive pads that are formed on a portion of one of the faces near one of the sides and are connected to the circuit. An integrally formed encapsulating mass encapsulates all of the one face except in the region of the pads, all of the other face except in a region opposite to the region of the pads, and all of the sides.

25 Claims, 28 Drawing Sheets

U.S. PATENT DOCUMENTS

| | | | |
|---|---|---|---|
| 4,783,695 | 11/1988 | Eichelberger et al. . | |
| 4,783,697 | 11/1988 | Benenati et al. . | |
| 4,832,324 | 5/1989 | Konishi et al. | 361/386 |
| 4,861,251 | 8/1989 | Moitzger | 425/116 |
| 4,868,349 | 9/1989 | Chia | 174/52.4 |
| 4,879,630 | 11/1989 | Boucard et al. . | |
| 4,881,884 | 11/1989 | De'Ath | 425/117 |
| 4,899,257 | 2/1990 | Yamamoto . | |
| 4,918,811 | 4/1990 | Eichelberger et al. . | |
| 4,933,042 | 6/1990 | Eichelberger et al. . | |
| 4,953,005 | 8/1990 | Carlson et al. . | |
| 5,019,946 | 5/1991 | Eichelberger et al. . | |
| 5,028,987 | 7/1991 | Neugebauer et al. | 357/80 |
| 5,206,986 | 5/1993 | Arai et al. . | |
| 5,331,203 | 7/1994 | Wojnarowski et al. . | |
| 5,334,857 | 8/1994 | Mennitt et al. | 257/48 |
| 5,365,403 | 11/1994 | Vinciarelli et al. . | |
| 5,375,322 | 12/1994 | Leeb . | |
| 5,395,226 | 3/1995 | Sakai et al. | 425/116 |

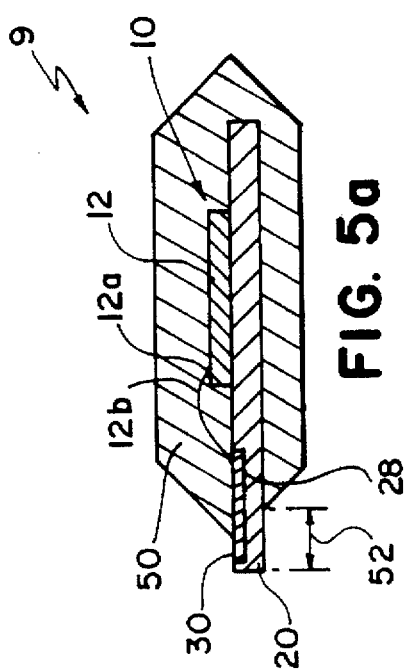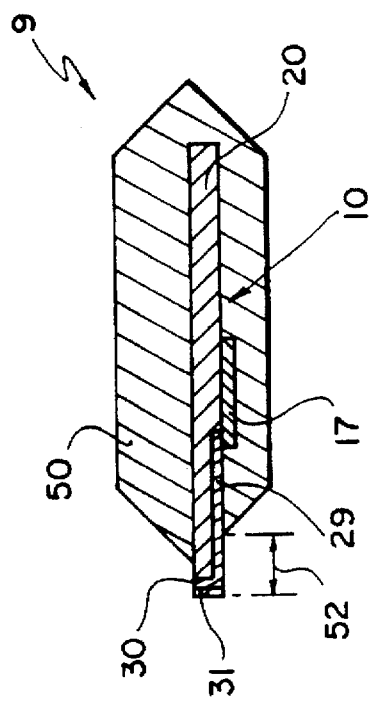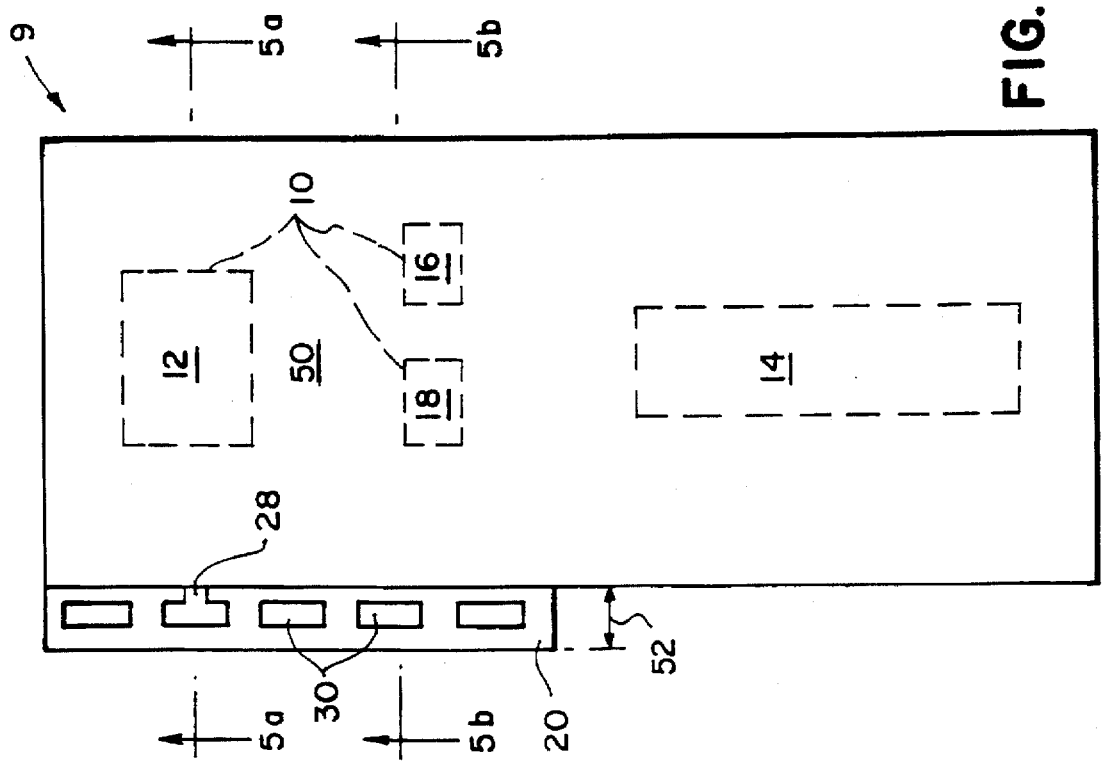

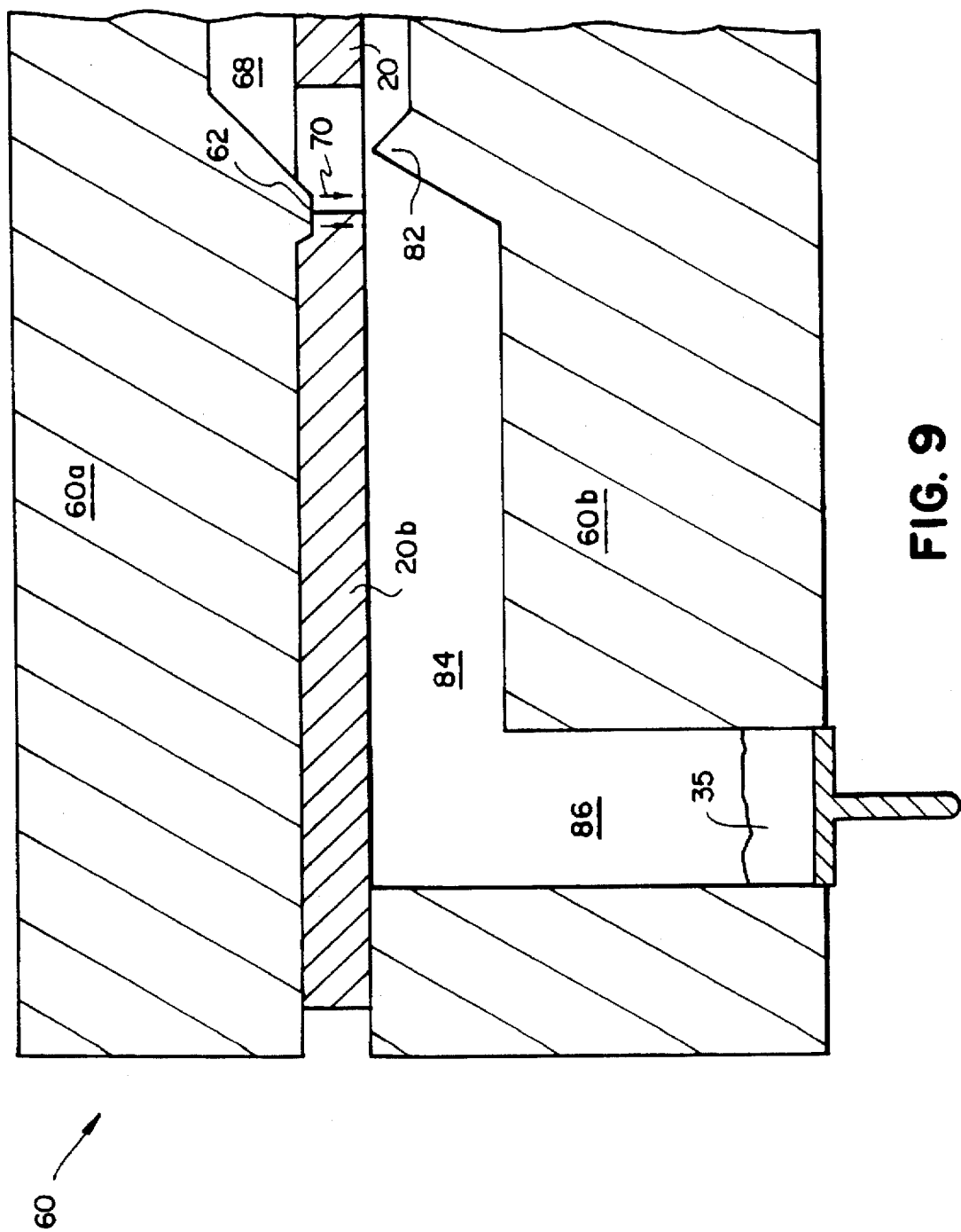

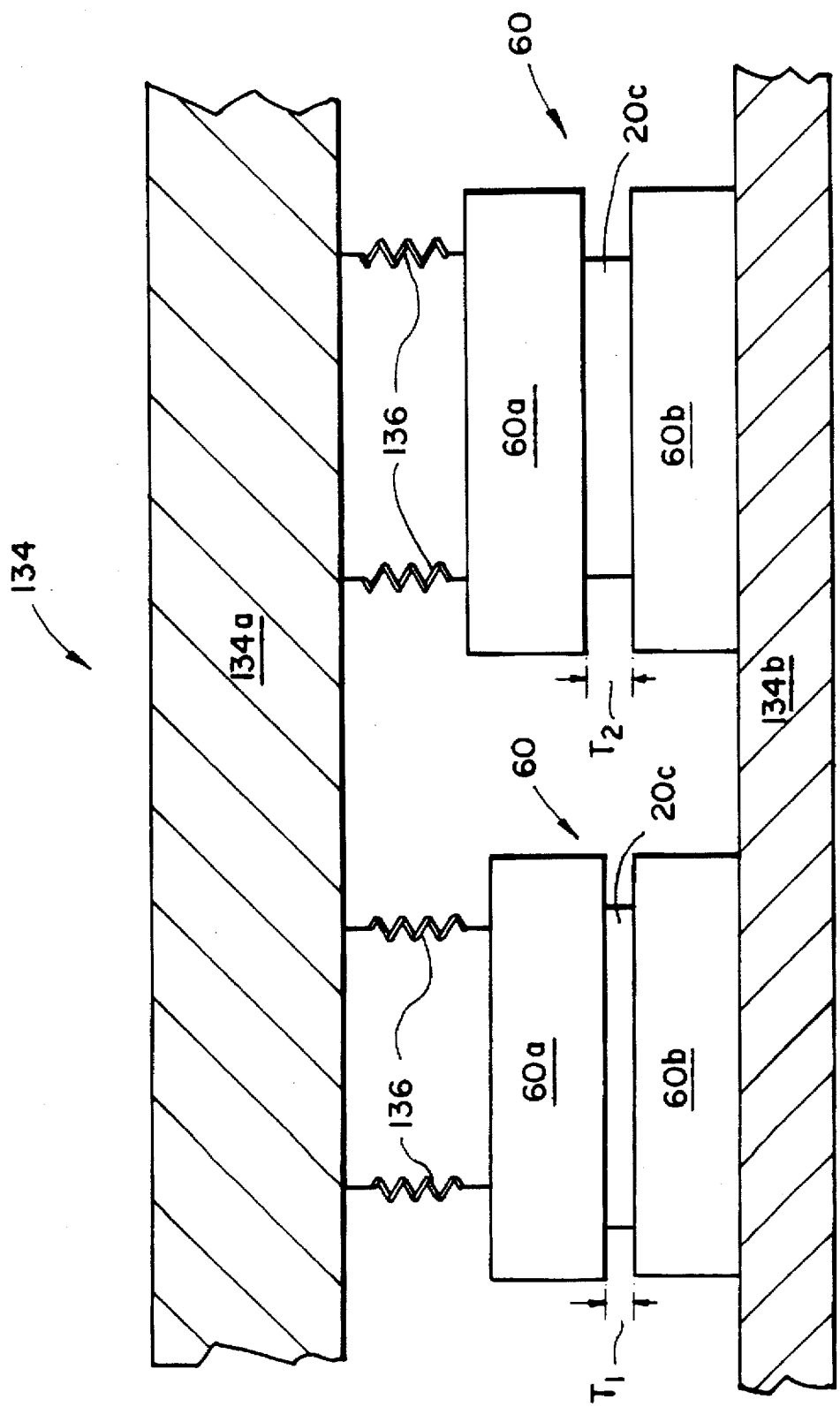

CIRCUIT ENCAPSULATION PROCESS

BACKGROUND

This invention relates to circuit encapsulation.

The circuit 10, shown in FIGS. 1a and 1b, for example, has integrated circuit dies (i.e., semiconductor dies) 12, 14 and other electrical components 15, 16, 17, 18 connected by a printed circuit board (PCB) 20. Encapsulation of circuit 10 is done within a mold cavity 22 of a mold 24 (FIGS. 2a–2e) using a molding compound 35. Connections to PCB 20 are made available externally to the molding compound by soldering conductive leads 26a, 26b, 26c, 26d, 26e, and 26f (FIGS. 1a, 1b) of metal lead frame 26 to input/output (I/O) pads 30 of PCB 20.

I/O pads 30 are also connected through conductive leads to the electrical components of circuit 10. For clarity, only conductive leads 28 (FIG. 1a) and 29 (FIG. 1b) are shown. Metal lead 26b is connected to an I/O pad 30 which is connected to conductive lead 28. A conductive pad 12a on semiconductor die 12 may be connected through wire 12b to conductive lead 28 (FIG. 2b) or a conductive pad (not shown) on a bottom side of die 12 could be connected to conductive lead 28. Metal lead 26f is connected to an I/O pad 30 which is connected by a plated through hole 31 to conductive lead 29. A conductive pad (not shown) on a bottom side of electrical component 17 is directly connected to conductive lead 29.

Mold 24 has a top 24a and a bottom 24b that are closed on portions 26g and 26h (FIGS. 2a, 2d) and leads 26a, 26b, 26c, 26d, 26e, and 26f (FIGS. 2b, 2c, 2e) of lead frame 26. Once mold 24 is closed, transfer molding is done by pushing molding compound 35, at 1000 psi, from a pot 36 (in mold bottom 24b), using a piston 40, into a runner 38 (also in mold bottom 24b) and into mold cavity 22 to surround circuit 10. After molding, circuit 10, encapsulated in cured molding compound, is removed from mold 24, and lead frame 26 is cut along dashed line 42 (FIGS. 1a, 1b), and waste molding compound is trimmed away along dashed line 43.

In one example, lead frame 26 has a thickness of approximately 0.008 inches with a tolerance of +/−0.00025 inches. When lead frame 26 is at a minimum thickness (i.e., 0.008−0.00025=0.00775), top 24a closes against bottom 24b, as shown in FIGS. 2a, 2b, 2c (i.e., they touch). The pressure of mold 24 on lead frame 26 does not damage lead frame 26. When lead frame 26 is at a maximum thickness (i.e., 0.008+0.00025=0.00825), top 24a does not close against bottom 24b leaving a gap 44, as shown in FIGS. 2d, 2e. The maximum height of gap 44 is 0.0005 inches (i.e., maximum thickness variance, 0.00025+0.00025=0.0005). Typical molding compounds will not leak, indicated by arrow 45, through a gap 44 of 0.0005 inches or less due to the viscosity of the molding compound.

Referring to FIGS. 3a, 3b, 3c, metal lead frame 26 (FIGS. 1a, 1b) is not needed to make external connections to I/O pads 30 of a component 9 because only a portion of one side of PCB 20 is encapsulated in cured molding compound 50 leaving I/O pads 30 exposed. Electrical components are generally not mounted in the exposed areas.

The thickness of PCB 20 is approximately 0.020 inches and has a tolerance of +/−0.0025 inches. The maximum thickness variation of 0.005 inches (i.e., 0.0025+0.0025=0.005) makes it difficult to use conventional molds to fully encapsulate circuit 10 (i.e., top, bottom, and sides) with the exception of I/O pads 30 (component 9, FIGS. 4, 5a, and 5b).

SUMMARY

In general, in one aspect, the invention features a method for encapsulating portions of a circuit formed on a substrate. The substrate has two faces and perimeter sides. Encapsulating surrounds, in molding compound, a portion of one of the faces of the substrate and a portion of the sides of the substrate, and during encapsulation a portion of the one face of the substrate that bears conductive pads is left unencapsulated.

Implementations of the invention include the following features. A portion of the other of the faces of the substrate may also be encapsulated in molding compound. The conductive pads may be electrically connected to electronic components mounted on the substrate and encapsulated in the molding compound. Encapsulating may include inserting the substrate into a mold, closing a top of the mold and a bottom of the mold against the substrate, and pushing molding compound from a conduit having a top defined by the substrate into a chamber in the mold. Encapsulating may also include inserting the substrate into a mold, the substrate including an active portion on which the conductive pads and electronic components are mounted and a waste portion connected to the active portion by a segment in the area of the conductive pads, closing a top of the mold and a bottom of the mold against the waste portion and the segment of the active portion in the area of the conductive pads, and pushing molding compound from a conduit, having a top defined by the waste portion into a chamber in the mold. There may be multiple segments including conductive pads. Closing the mold may include causing a ridge on the top of the mold to extend down against the waste portion and the segment of the active portion in the area of the conductive pads, and causing a first ridge on the bottom of the mold to press up against the waste portion and the segment including the conductive pads. Closing the mold may also include causing a ridge on the top of the mold to extend down against the waste portion, a first segment of the active portion in the area of the conductive pads, and a second segment of the active portion, and causing a first ridge on the bottom of the mold to press up against the waste portion, the first segment, and the second segment. There may be many second segments of the active portion. An end of the conduit may be defined by a second ridge on the bottom of the mold. The top of the mold and the bottom of the mold may be separated by the substrate. The mold may be connected to a compliance mechanism of a press that allows the press to provide an even pressure distribution across the substrate. The press may include many molds and a compliance mechanism for attachment to each of the molds. The compliance mechanism may be a spring, a pneumatic cylinder, or a hydraulic cylinder. Encapsulating may further include curing the molding compound, removing the substrate with exposed conductive pads from the mold, and cutting away the waste portion and waste molding compound. The conduit may be a pot and a runner both of which may be in the bottom of the mold. Encapsulating may encapsulate many circuits in one mold having many cavities.

In general, in another aspect, the invention features an encapsulated circuit including a substrate having two faces and perimeter sides around the faces and a circuit formed on the substrate. The substrate also includes conductive pads that are formed on a portion of one of the faces near one of the sides and are connected to the circuit. An integrally formed encapsulating mass encapsulates all of the one face except in the region of the pads, all of the other face except in a region opposite to the region of the pads, and all of the sides.

Implementations of the invention include the following features. The circuit may include electronic components mounted on both faces of the substrate and encapsulated in the encapsulating mass. The conductive pads may be formed on more than one portion of the one face near the sides, and the conductive pads may also be formed on a portion of the other face near one of the sides or on more than one portion of the other face near the sides. In each case, the encapsulating mass may encapsulates all of the faces except the regions of the pads.

Advantages of the invention include the following. Reducing the size of a circuit having components mounted on both sides of a substrate by partially encapsulating the substrate to leave input/output (I/O) pads exposed and available for external connections. The substrate is not damaged by the molding process, and the cured molding compound provides a high voltage breakdown allowing the component to be placed in close proximity to other components.

A variety of other advantages and features will become apparent from the following description and from the claims.

DESCRIPTION

We first describe the drawings:

FIGS. 1a and 1b are plan views of a top and a bottom, respectively, of a circuit connected to a metal lead frame.

FIGS. 2a, 2b, 2c, 2d, and 2e are cross-sectional side views of the structure of FIGS. 1a and 1b inserted within a mold.

FIGS. 3b and 3c are plans of a top and a bottom, respectively, of the circuit of FIG. 3a.

FIG. 4 is a cross-sectional side view of a circuit having a portion of a top, a bottom, and sides of a substrate encapsulated in molding compound.

FIGS. 5a and 5b are cross-sectional side views of the structure of FIG. 4.

Figure 6A:
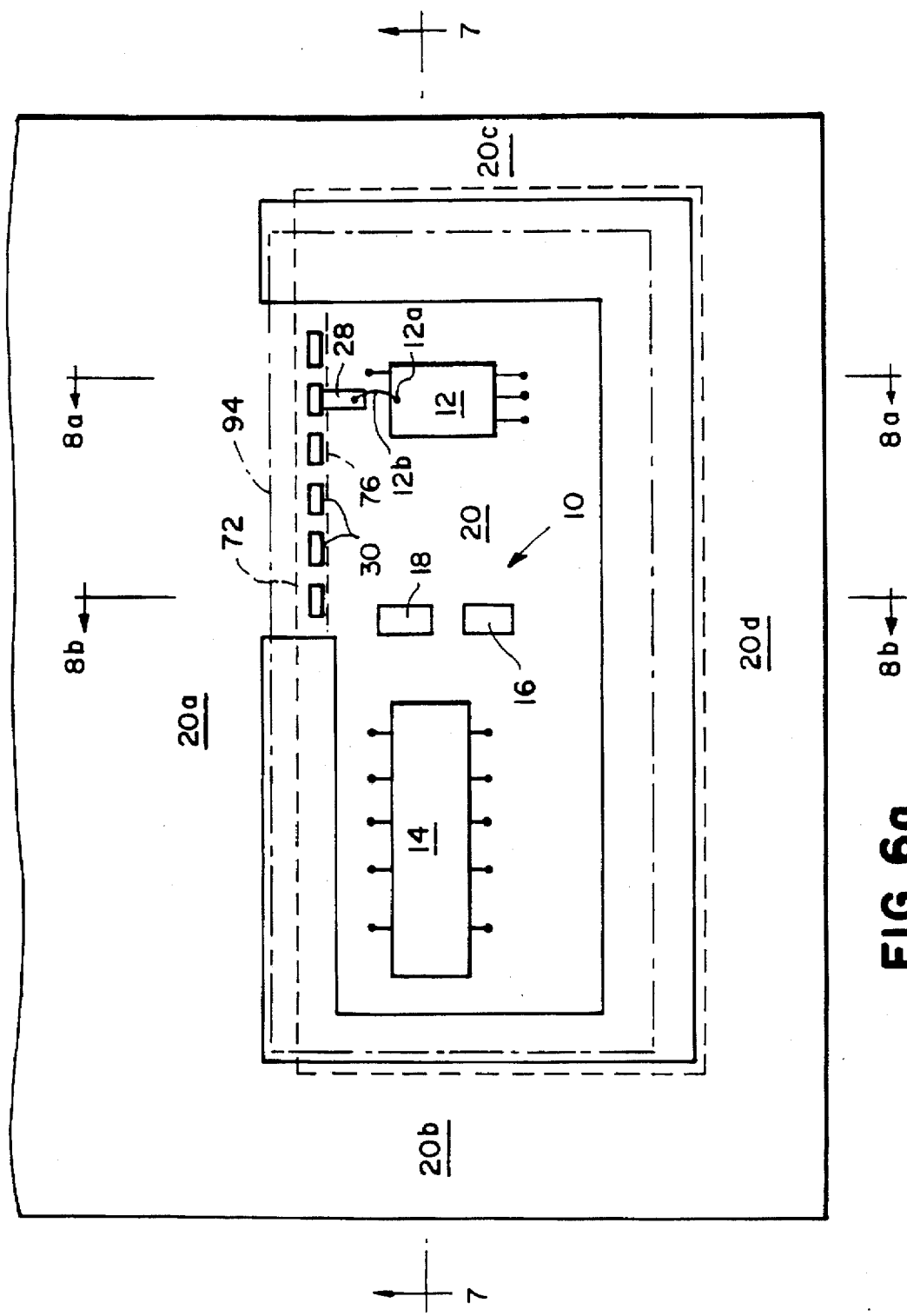
FIGS. 6a and 6b are plans of the unencapsulated circuit of FIG. 4.
Figure 6B:
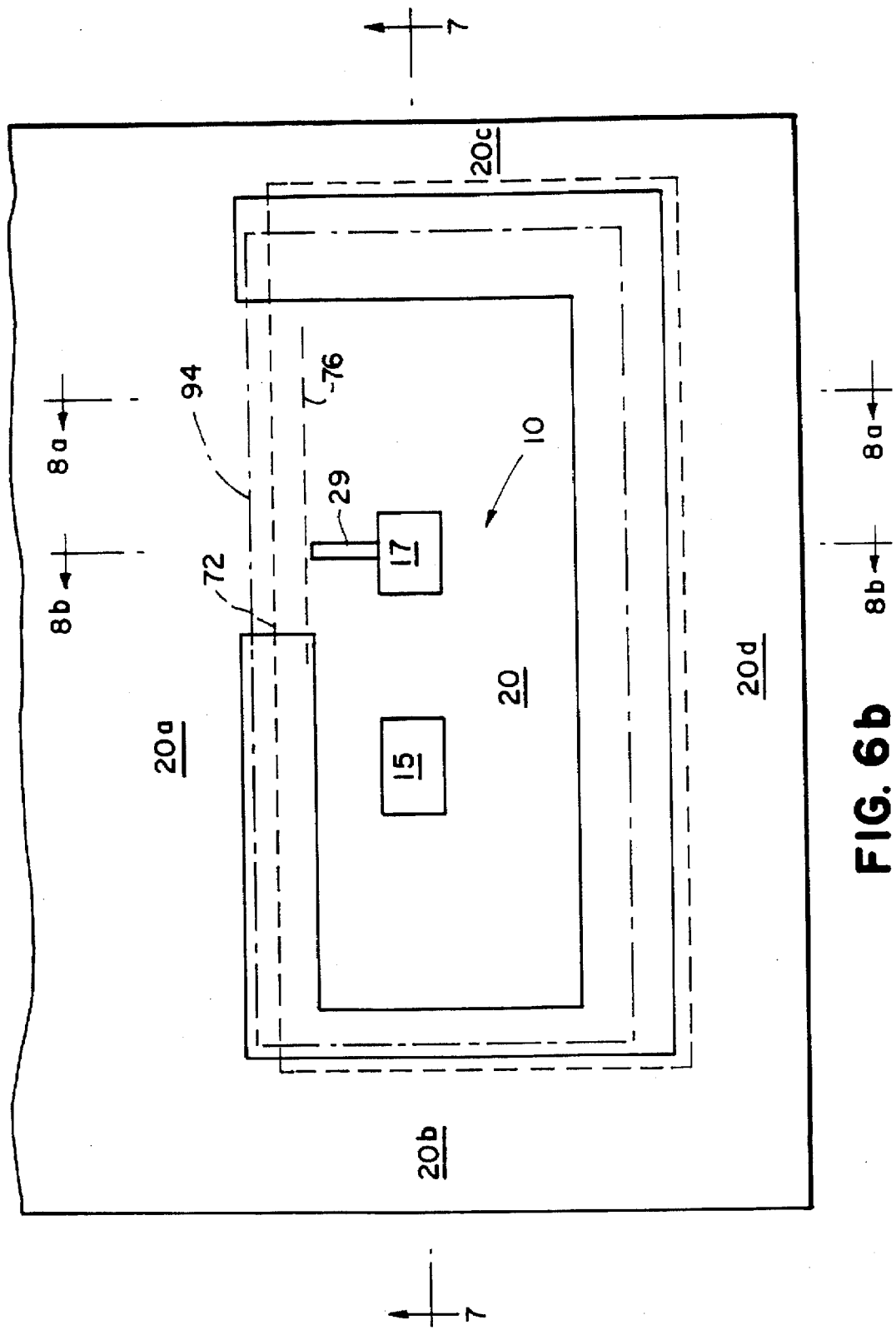
Figure 7:
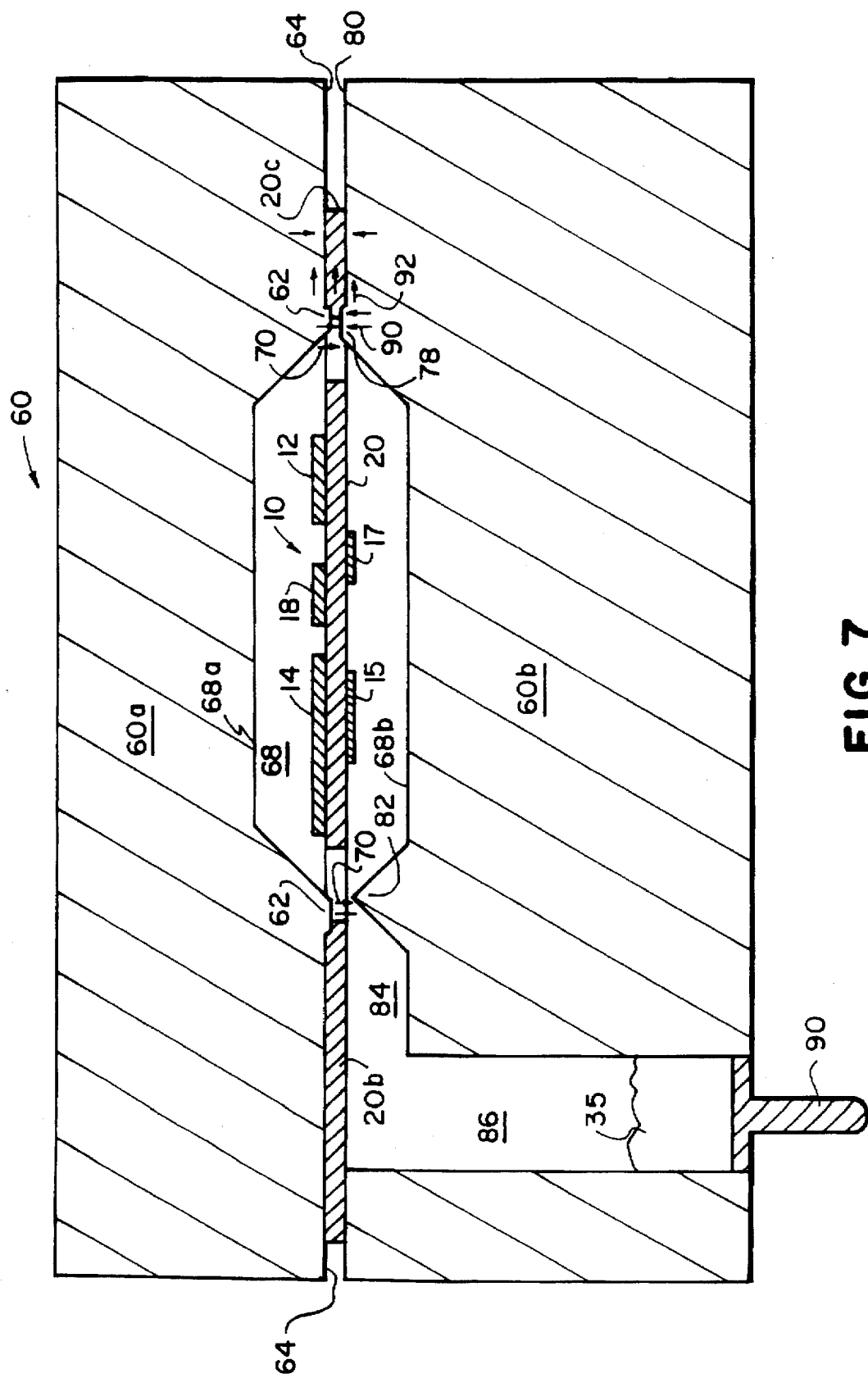

FIGS. 7, 8a, 8b, and 9 are cross-sectional side views of the circuit of FIGS. 6a and 6b inserted in a mold.

Figure 10:
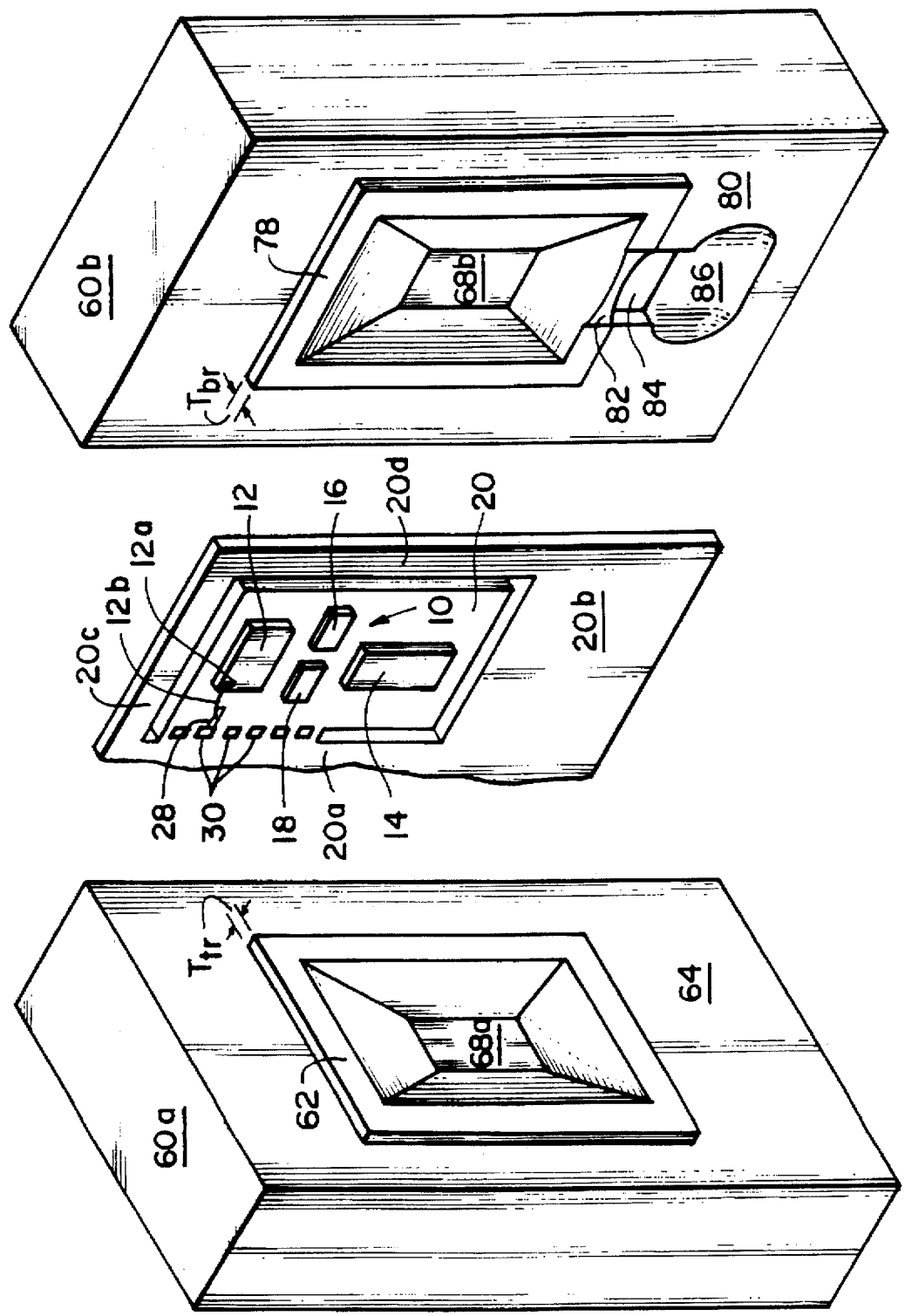

FIG. 10 is an exploded perspective view of the circuit of FIGS. 6a and 6b and the mold of FIGS. 7, 8a, 8b, and 9.

Figure 11:
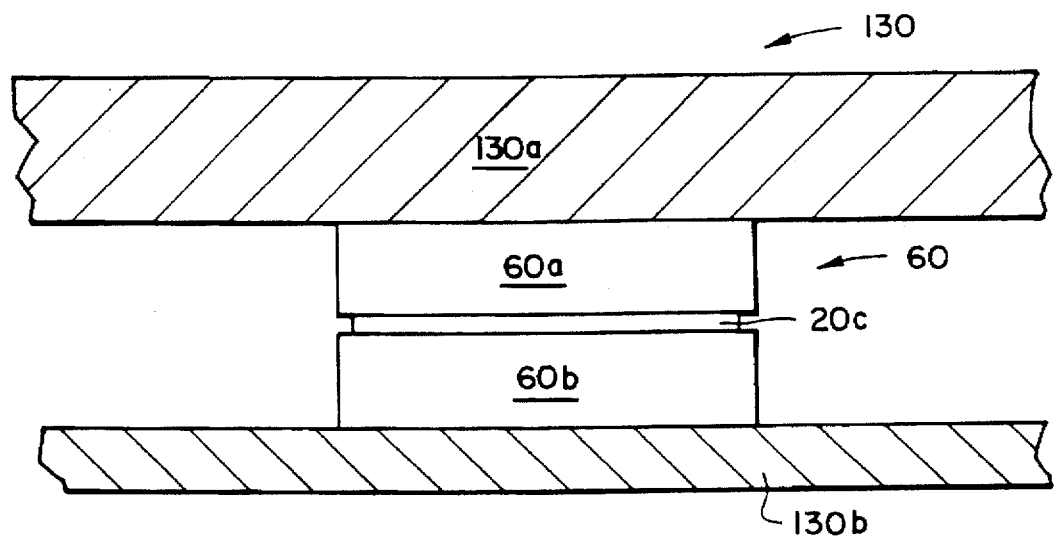
Figure 12:
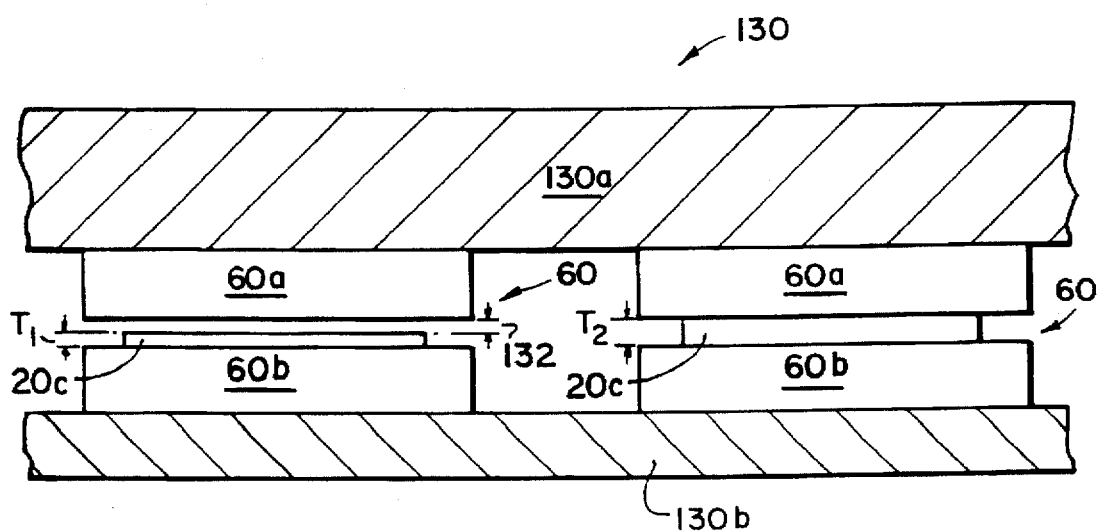

FIGS. 11 and 12 are cross-sectional side views of a press.

Figure 13B:
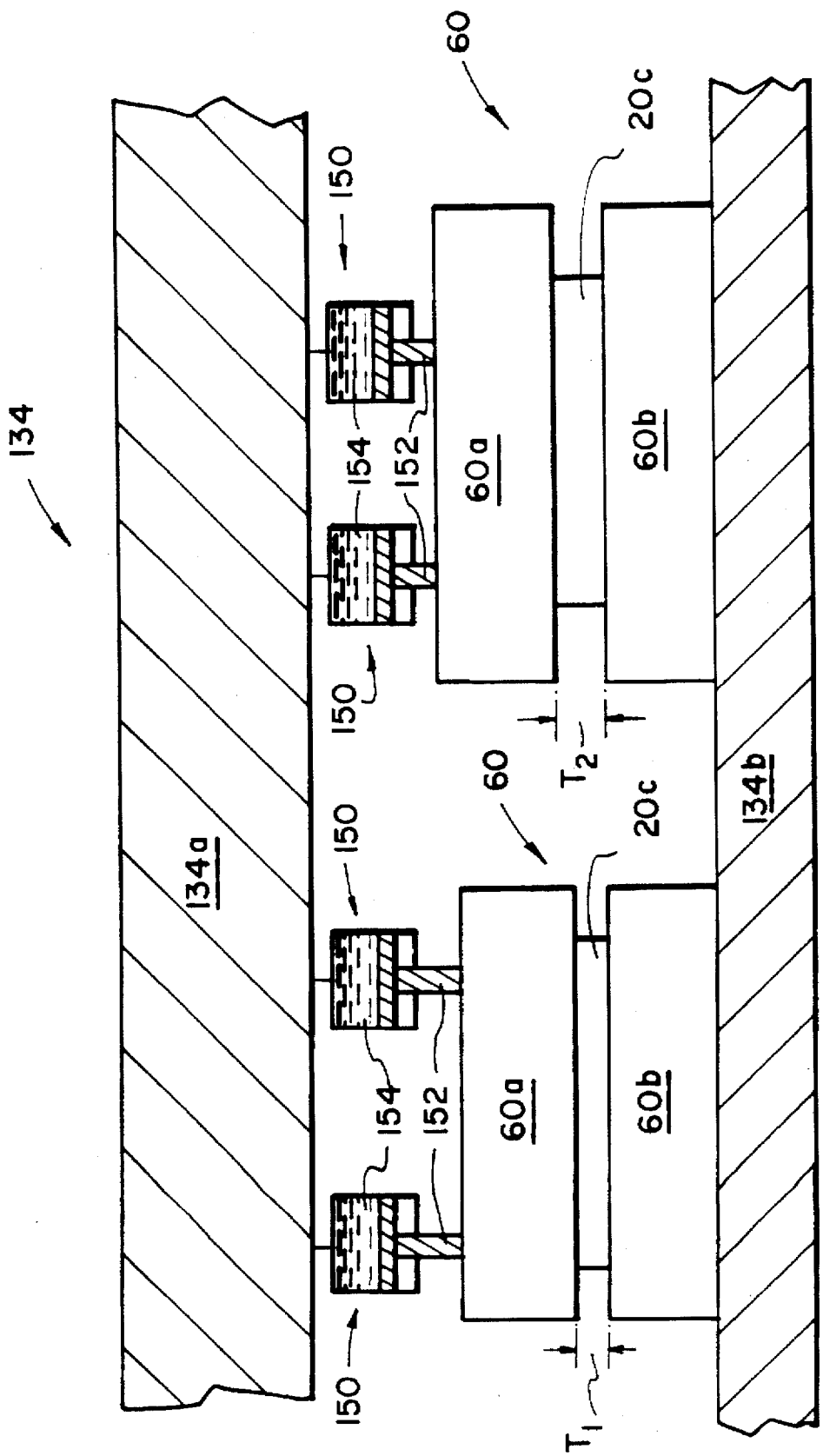
Figure 13C:
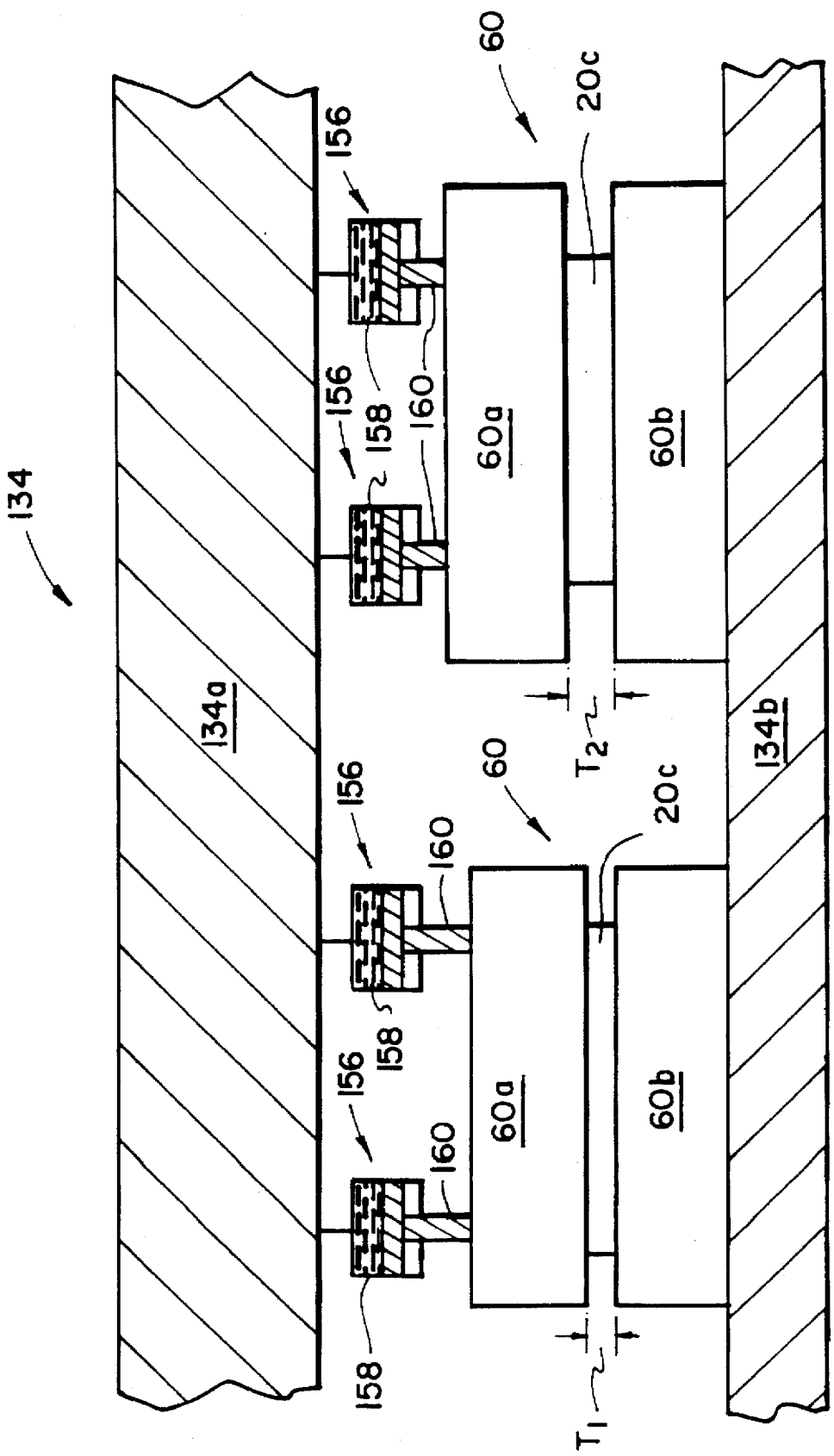

FIGS. 13a, 13b, 13c are cross-sectional side views of presses including compliance mechanisms attached to molds.

Figure 14:
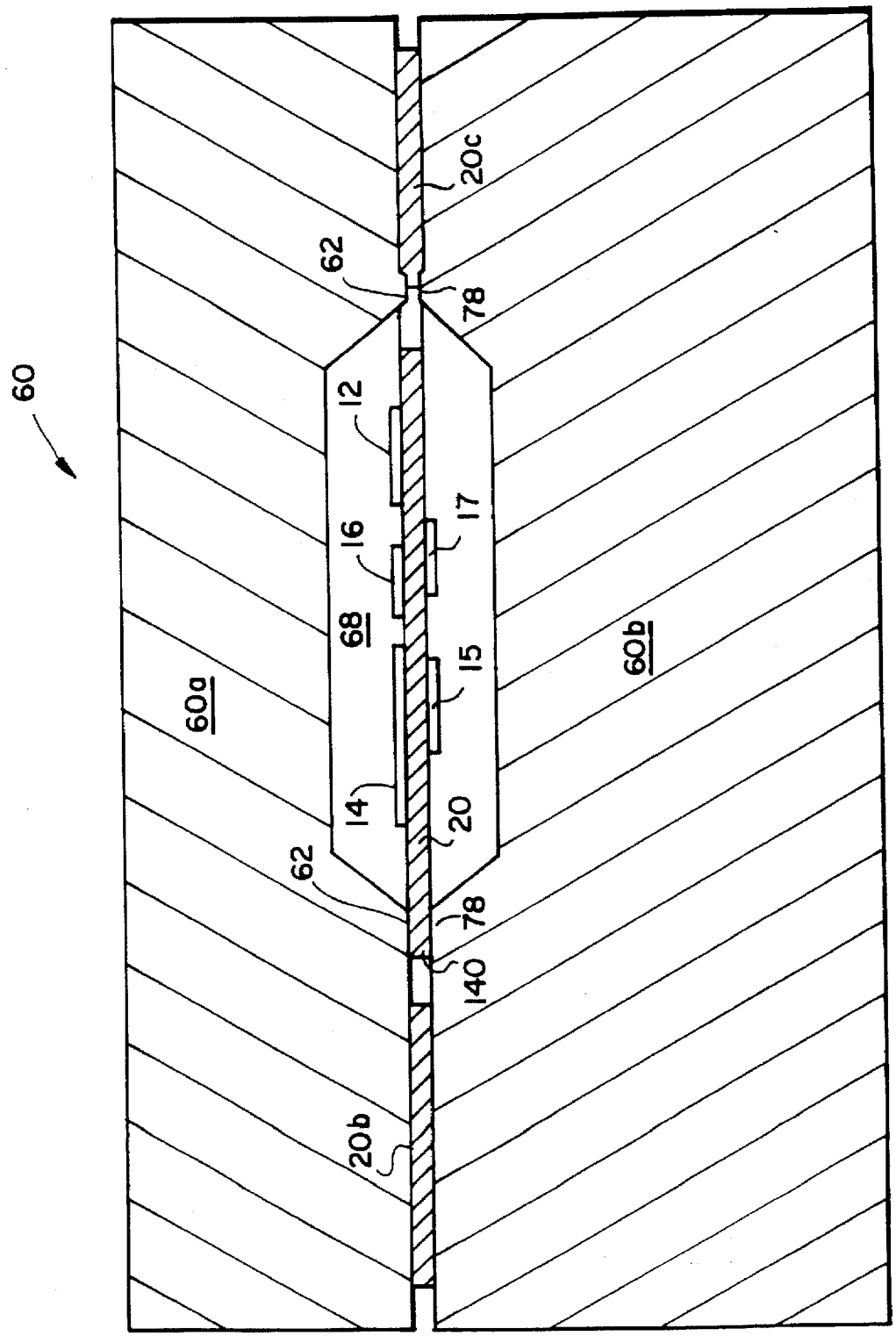
Figure 15:
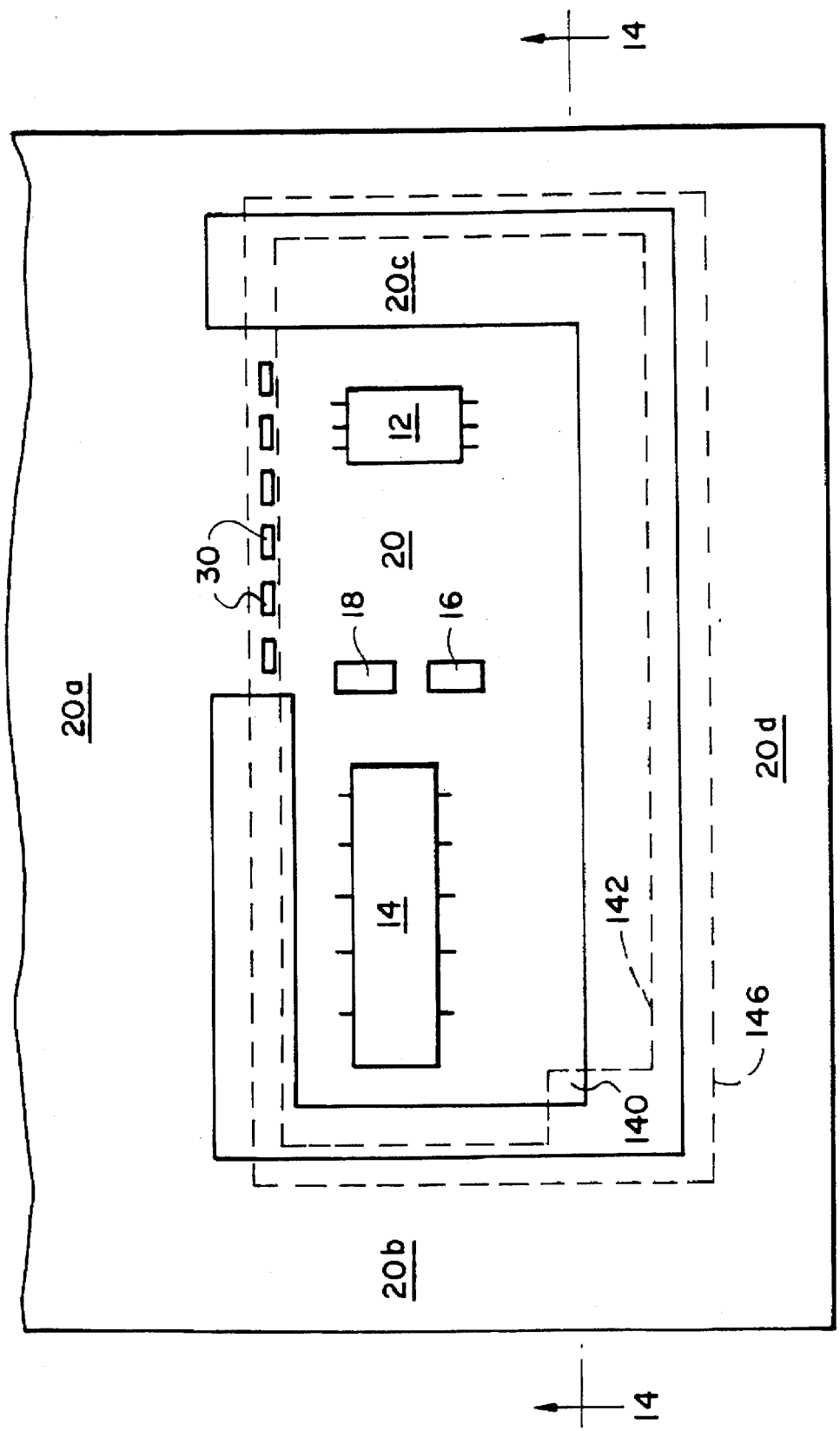

FIG. 14 is a cross-sectional side view of the circuit of FIG. 15 within a mold.

FIG. 15 is plan showing a circuit.

Figure 16:
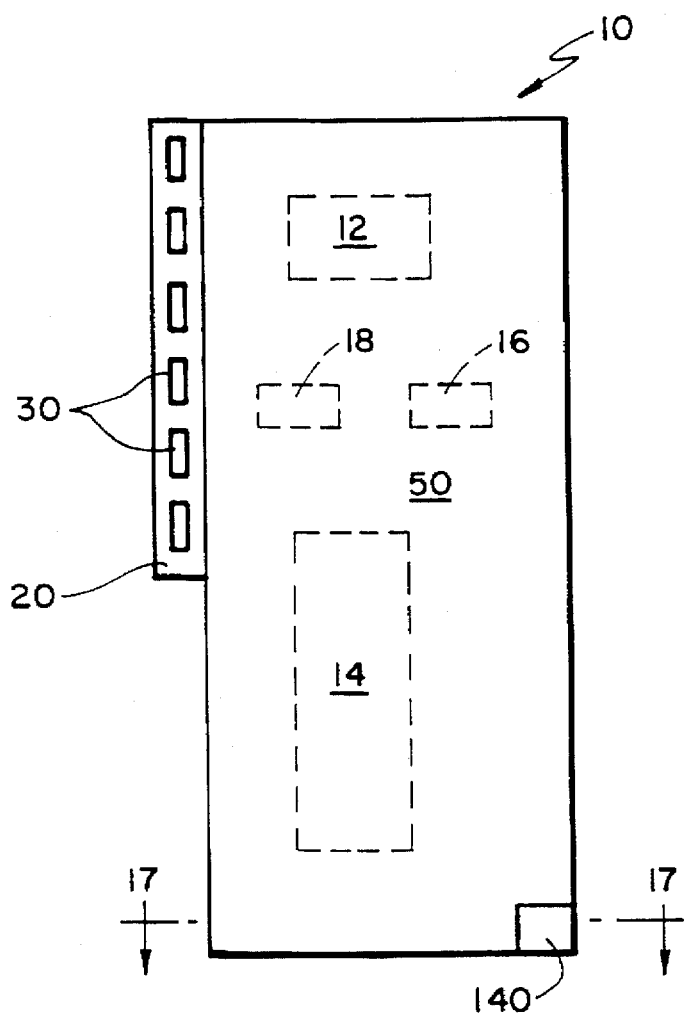

FIG. 16 is a plan showing the circuit of FIG. 15 partially encapsulated.

Figure 17:
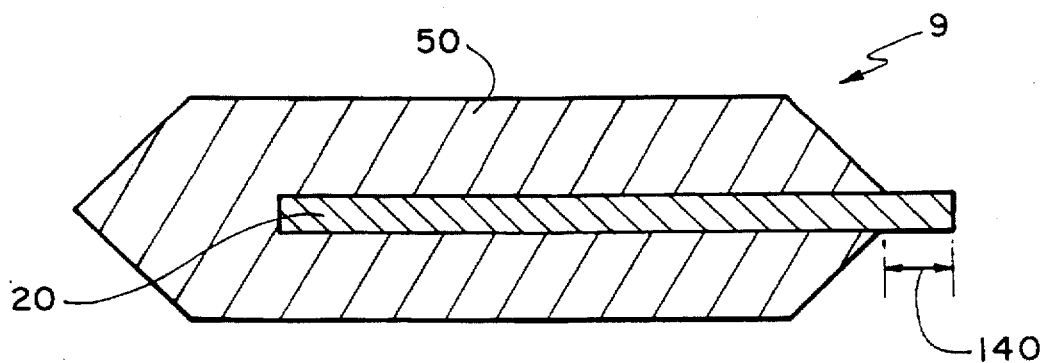

FIG. 17 is a cross-sectional side view of the structure of FIG. 16.

Figure 18:
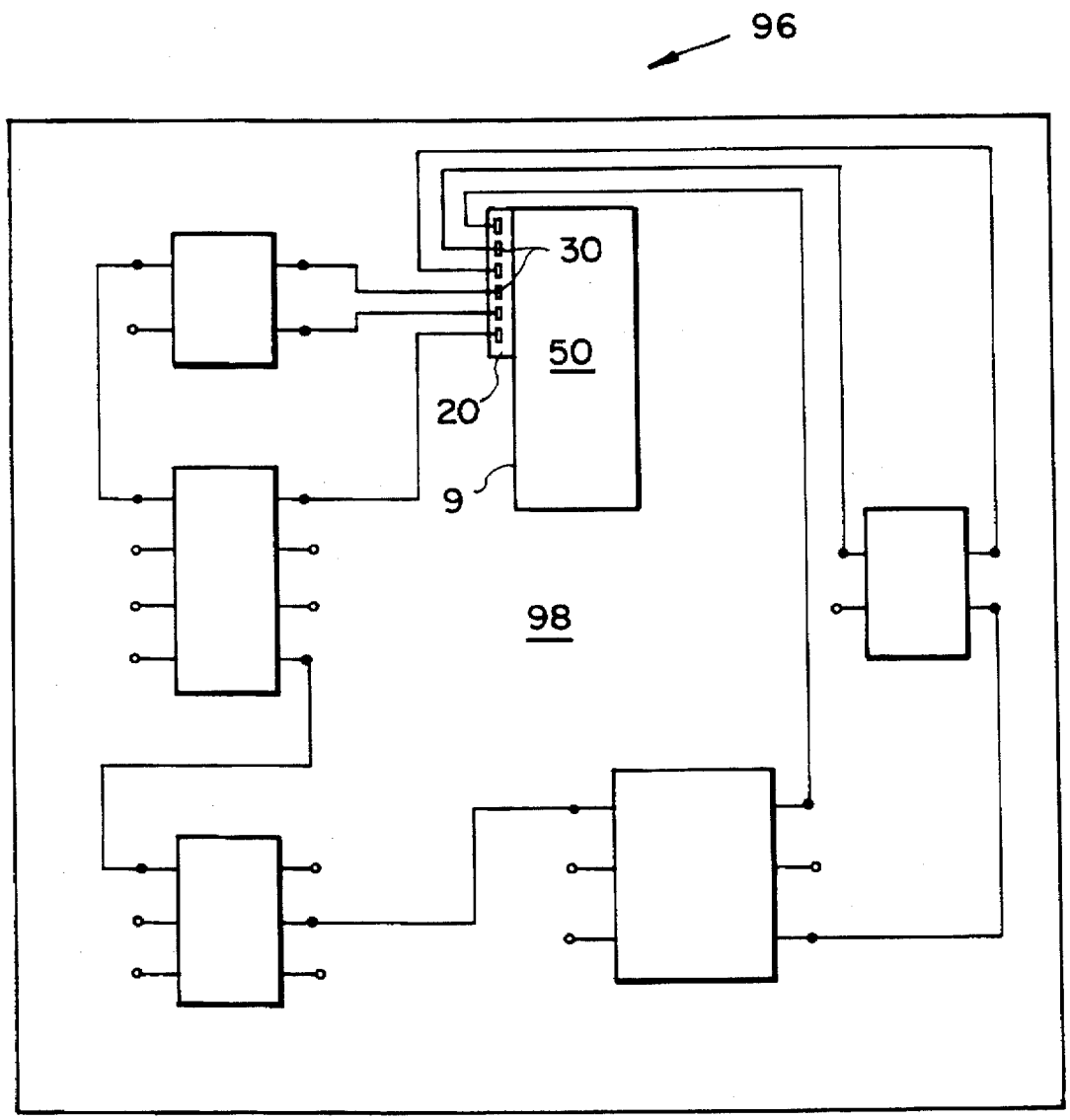

FIG. 18 is a plan of a larger circuit including the circuit of FIG. 4.

Figure 19:
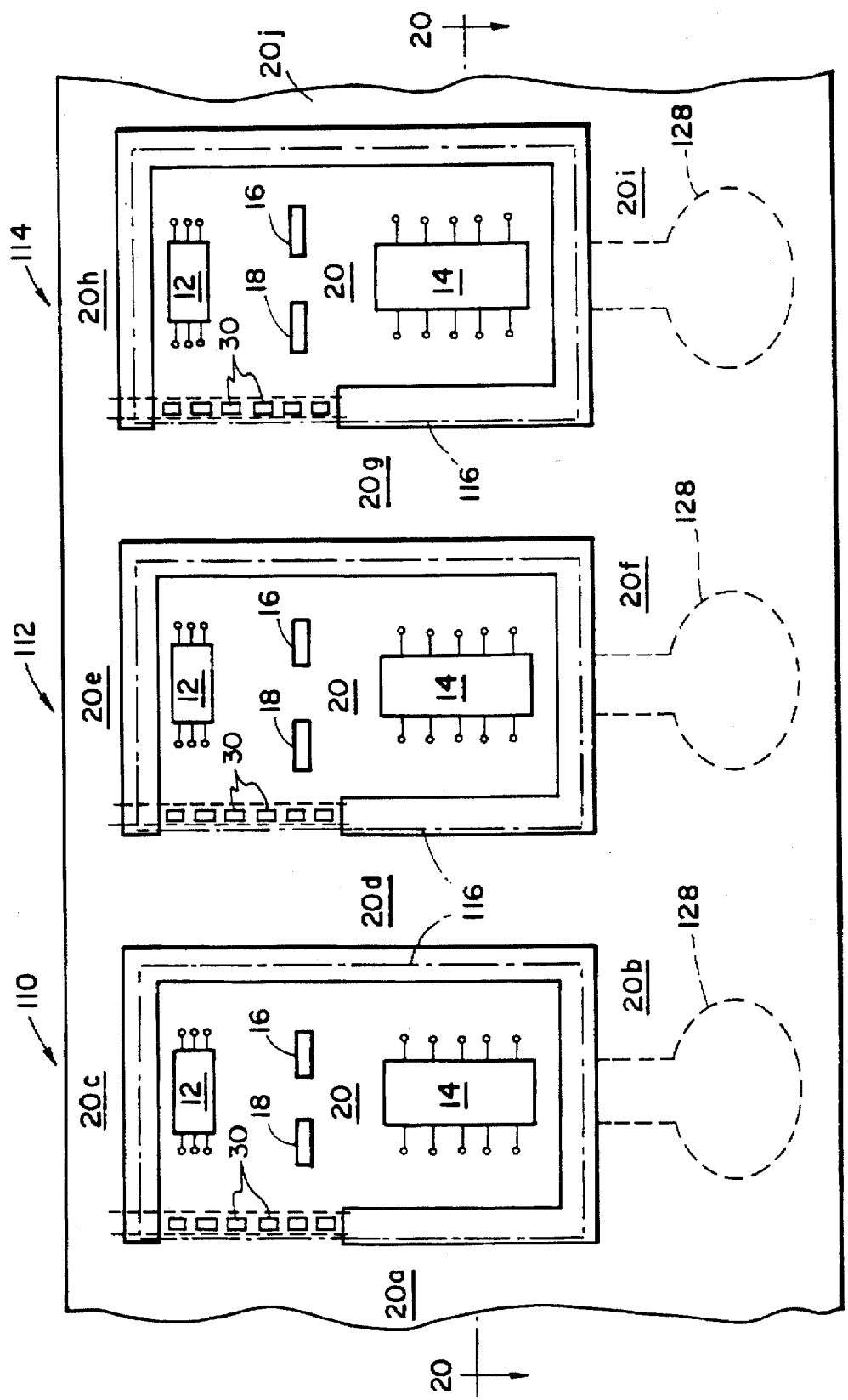

FIG. 19 is a plan of a substrate including three unencapsulated circuits.

Figure 20:
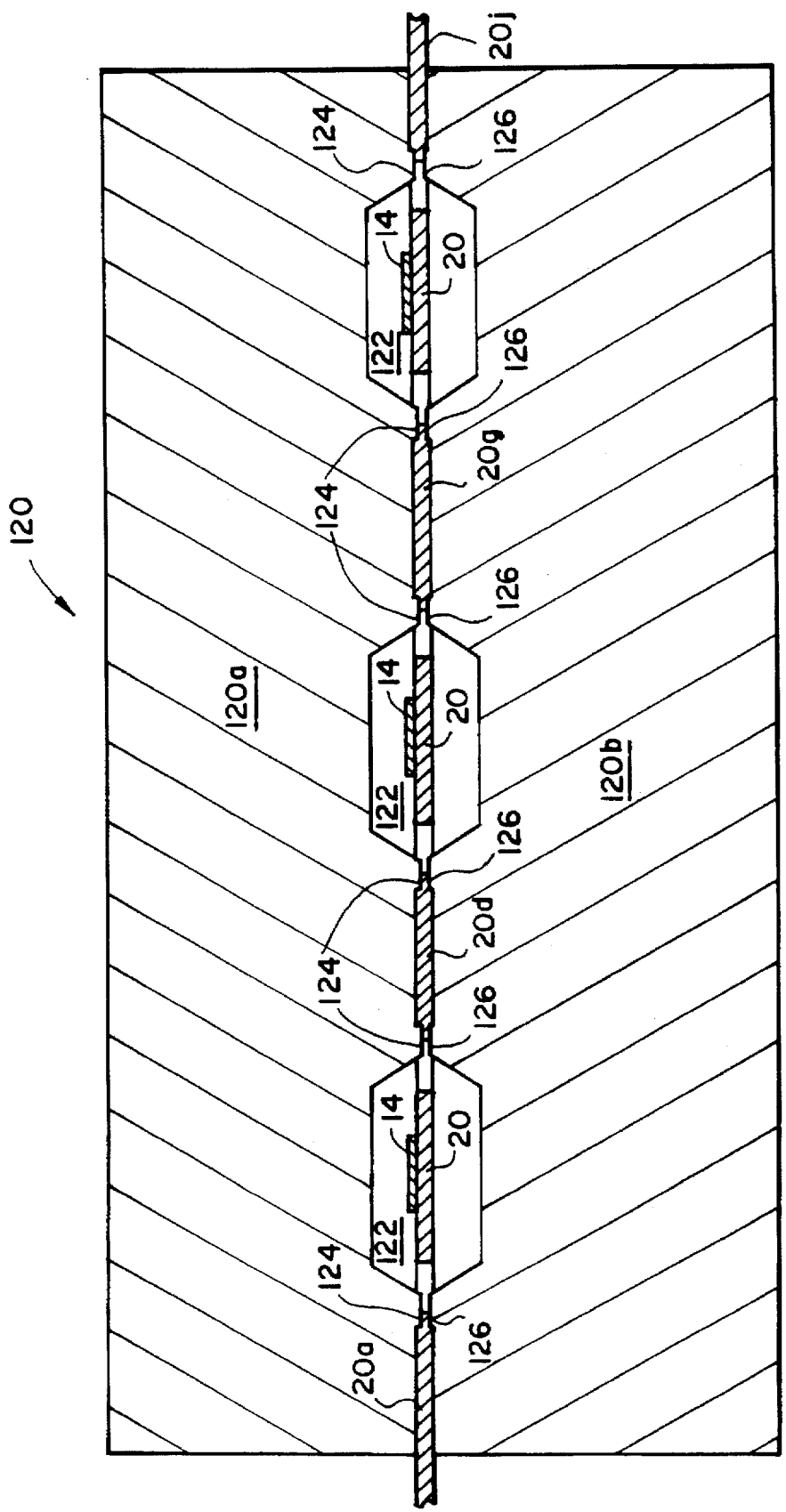

FIG. 20 is a cross-sectional side view of the substrate of FIG. 19 inserted within a mold.

Figure 21:
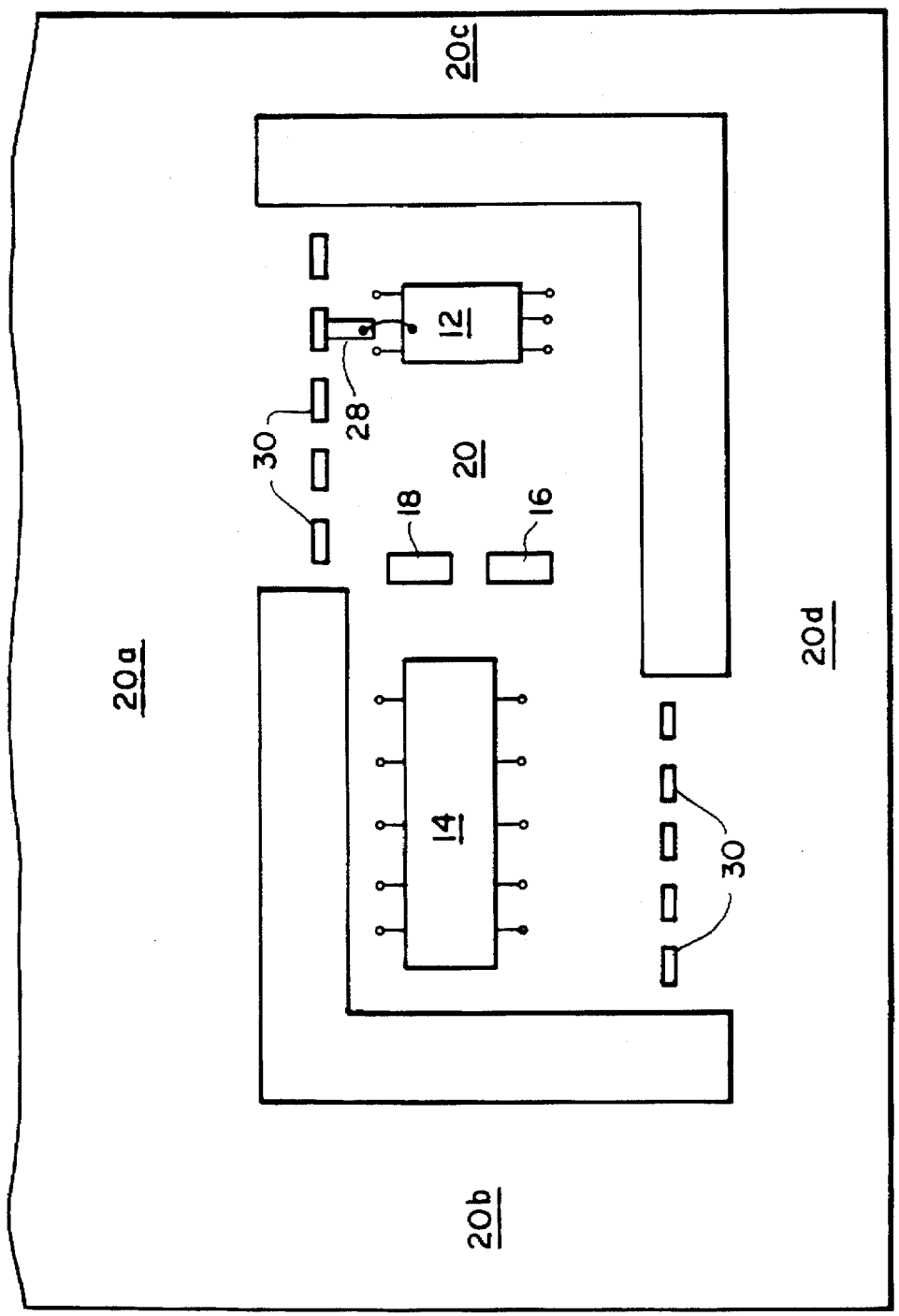
Figure 22:
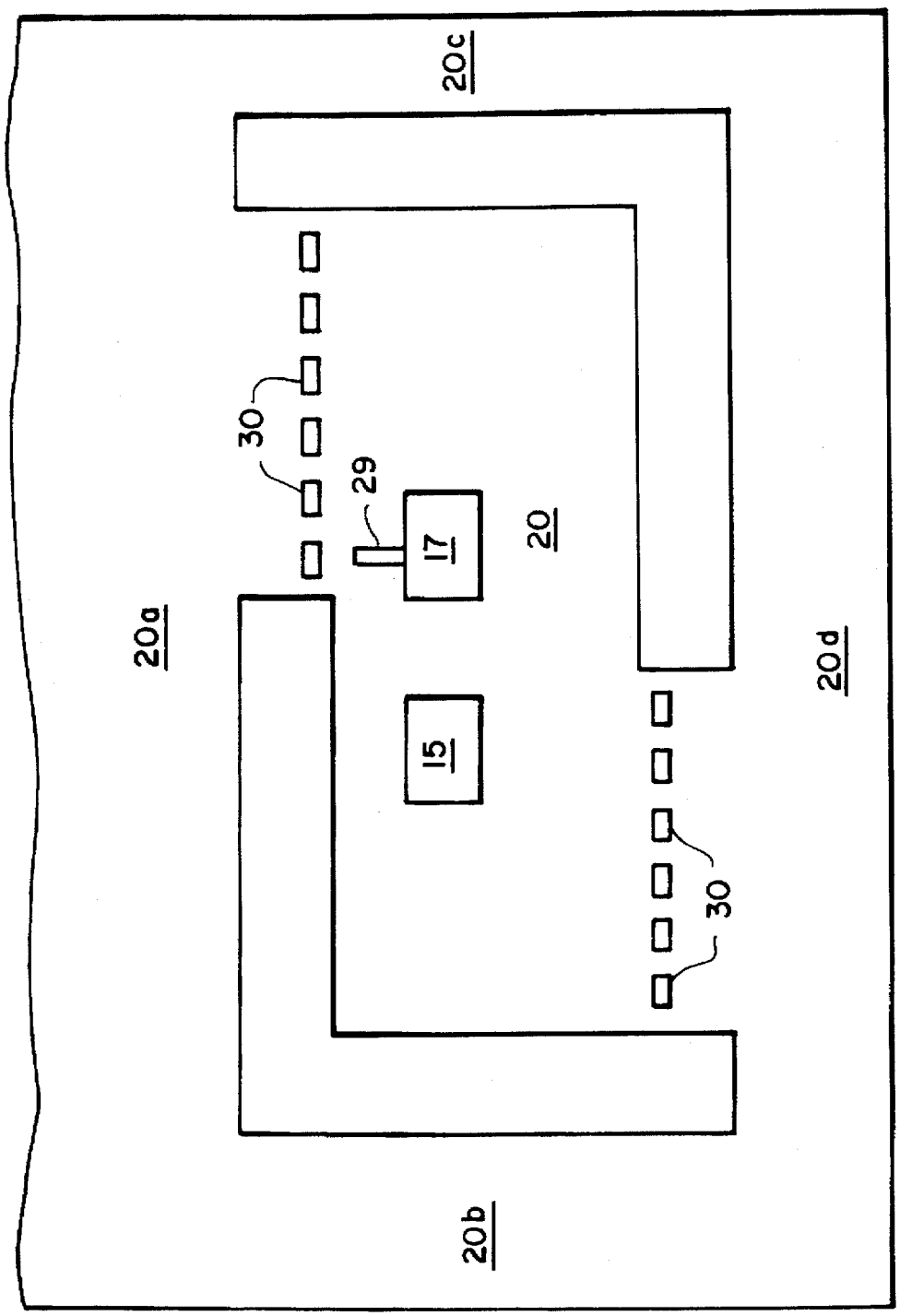

FIGS. 21 and 22 are plans of a top and a bottom, respectively, of a substrate showing a circuit having four areas with conductive pads.

Figure 1A:
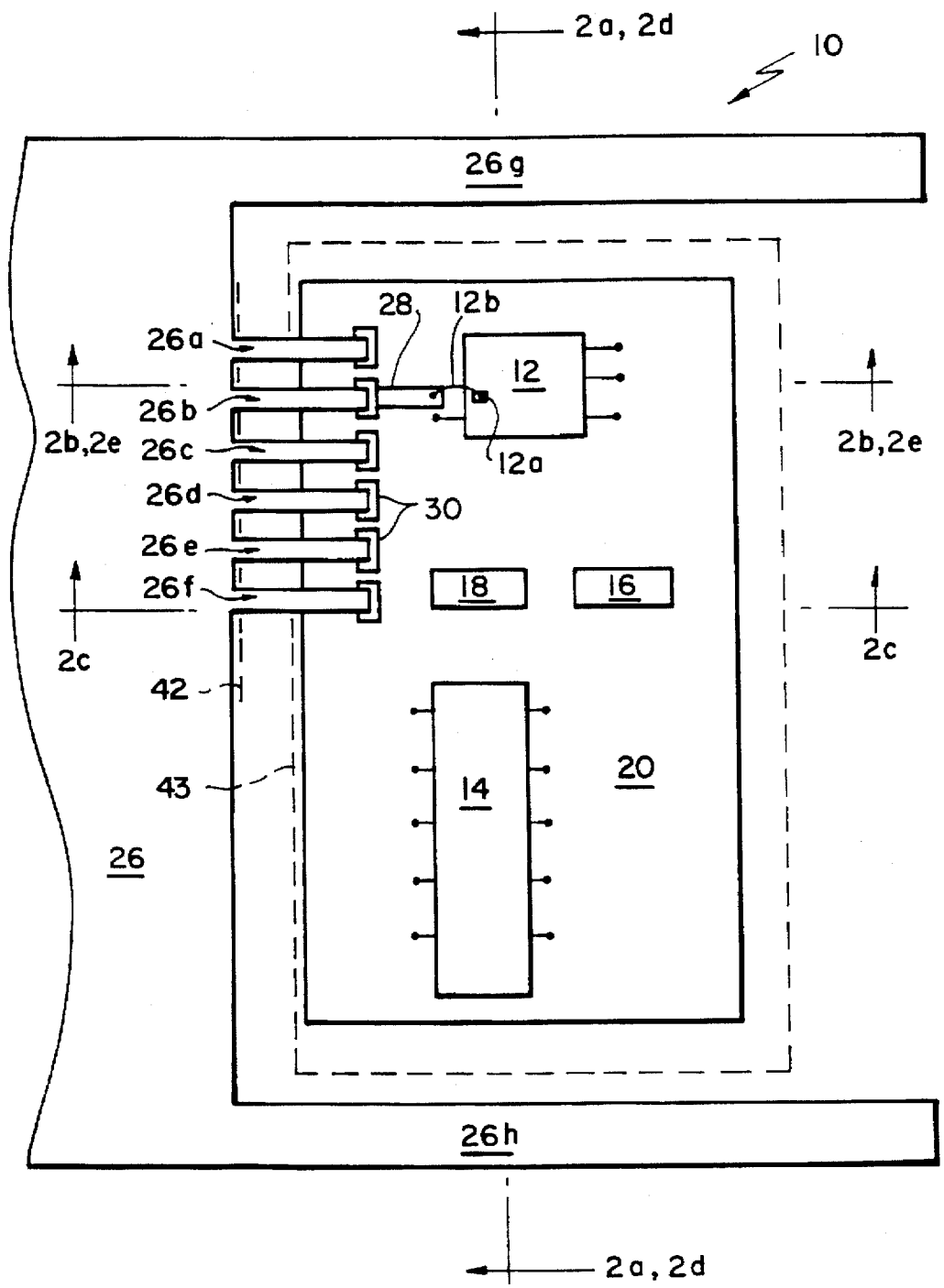
Figure 1B:
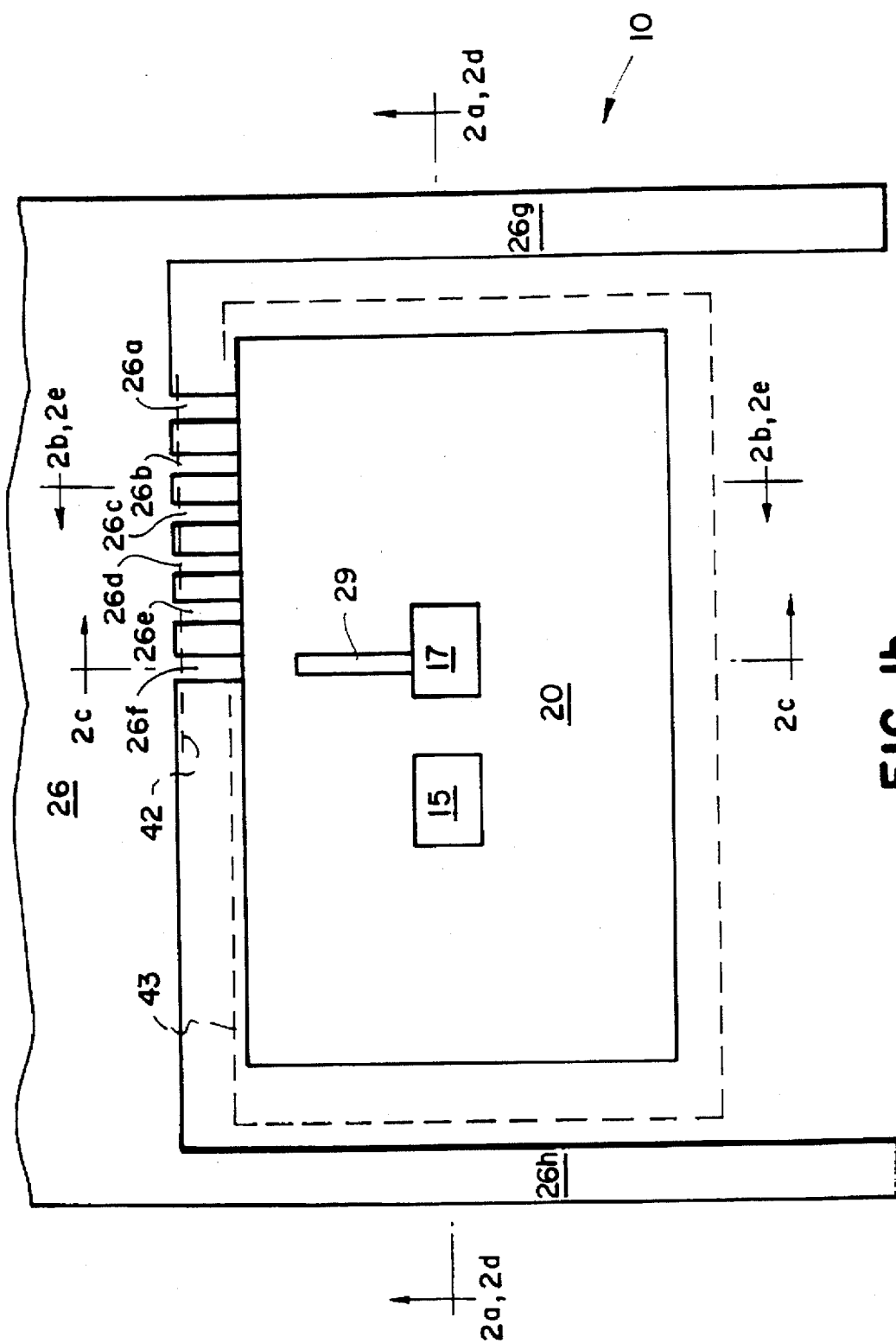

Referring to FIGS. 4, 5a, and 5b, a component 9 includes a circuit 10, having electrical components 12, 14, 15, 16, 17, and 18 mounted on both sides of printed circuit board (PCB) 20, that is only partially encapsulated in cured molding compound 50. Input/Output (I/O) pads 30, located on a portion 52 of PCB 20, are exposed (i.e., not encapsulated). This reduces the size of component 9 by allowing connections to be made directly with I/O pads 30 (i.e., without leads 26a, 26b, 26c, 26d, 26e, and 26f, FIGS. 1a, 1b). The size of component 9 is also reduced by having components mounted on both sides of PCB 20.

Figure 8A:
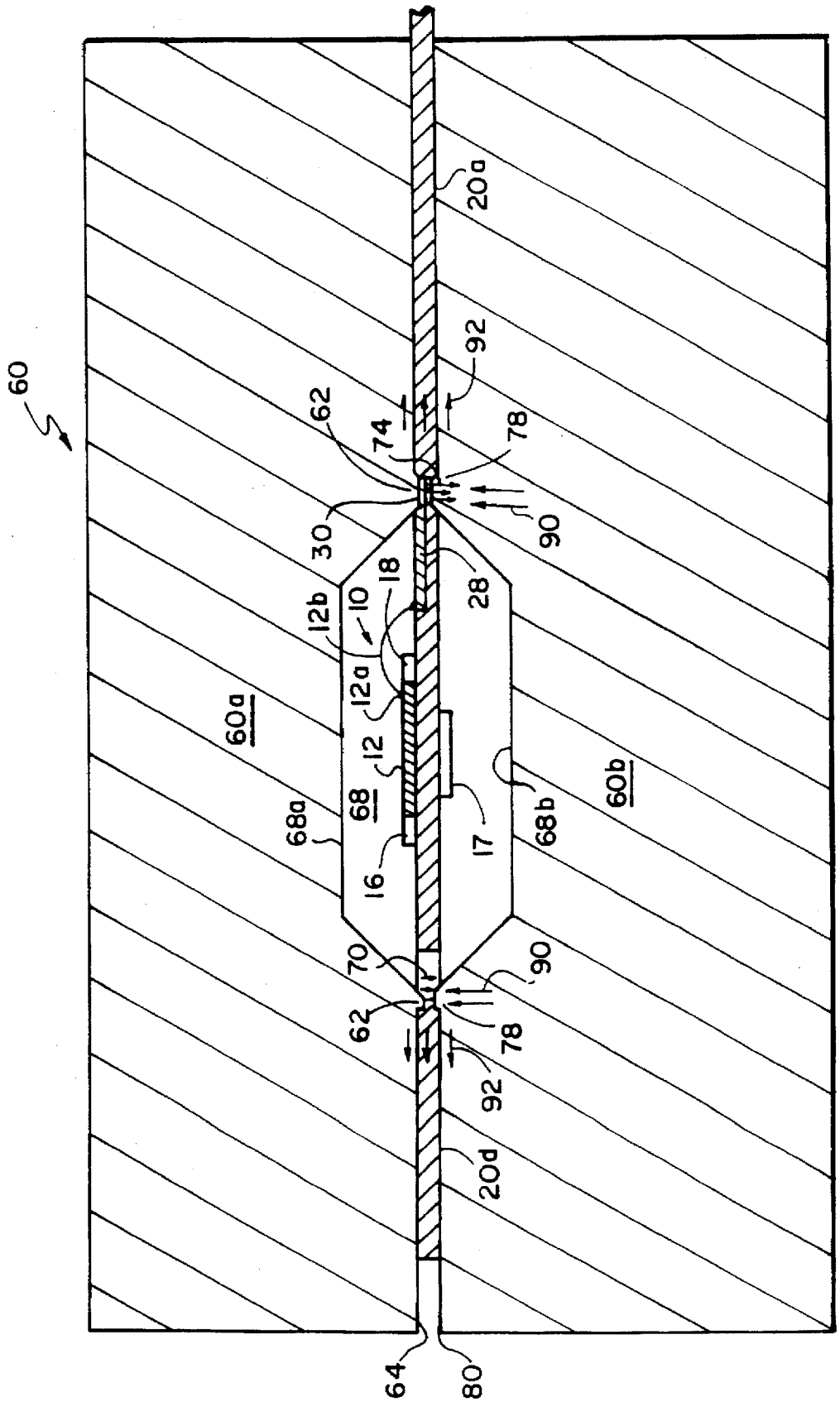

For clarity, only conductive leads 28 and 29 of PCB 20 are shown. Wire 12b connects conductive pad 12a of semiconductor die 12 to conductive lead 28 which is connected to an I/O pad 30 (FIGS. 5a, 6a, 8a). A conductive pad (not shown) on a bottom side of component 17 is connected to conductive lead 29 which is connected to an I/O pad 30 through a plated through hole 31 (FIGS. 5b, 6b, 8b).

In order to provide component 9 as shown in FIGS. 4, 5a, and 5b, unencapsulated circuit 10 is inserted into a mold 60, shown in FIGS. 7–10. Referring to FIGS. 6a, 6b, instead of a lead frame 26 (FIGS. 1a, 1b), unencapsulated circuit 10 has PCB waste portions 20a, 20b, 20c, and 20d.

Figure 8B:
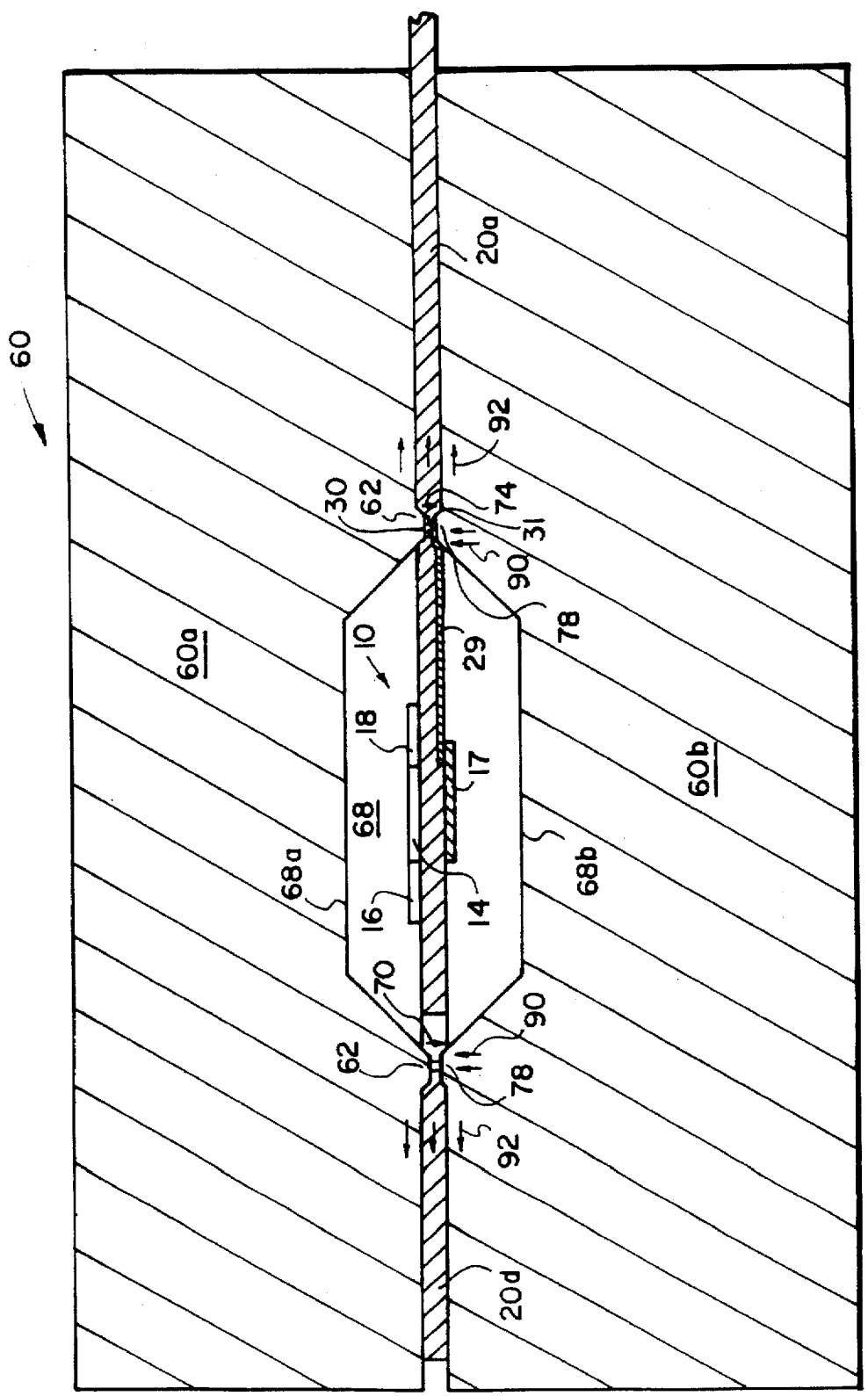

As shown in FIGS. 7–10, a top 60a of a mold 60 has a ridge 62 that extends, in a direction $T_{tr}$ (FIG. 10), approximately 0.001 inches, above a surface 64 of top 60a and surrounds a cavity 68a within top 60a (FIGS. 8a, 8b). When the top 60a and a bottom 60b of mold 60 are closed around circuit 10, ridge 62 pushes down (arrows 70, FIGS. 7, 8a, 8b) onto waste portions 20b, 20c, and 20d (along dashed line 72, FIG. 6a) and down (arrows 74, FIGS. 8a, 8b) onto the area between PCB 20 and waste portion 20a, including I/O pads 30 (between dashed lines 72, 76, FIG. 6a).

Bottom 60b of mold 60 has a ridge 78 that extends, in a direction $T_{br}$ (FIG. 10), approximately 0.001 inches, above a surface 80 of bottom 60b and around a first part of a cavity 68b within bottom 60b (FIGS. 8a, 8b). Bottom 60b also has a second ridge 82 that forms an end to a runner 84 within bottom 60b that is connected to a pot 86 also within bottom 60b (FIG. 9). Ridge 82 extends around a second part of bottom cavity 68b. When top 60a and bottom 60b of mold 60 are closed around circuit 10, cavities 68a and 68b form cavity 68 and ridge 78 pushes up (arrows 90, FIGS. 7, 8a, 8b) against waste portions 20a, 20c, and 20d (along dashed line 72, FIG. 6b).

Piston 90 (FIGS. 7, 9) is used to push liquid, uncured molding compound 35 from pot 86 into runner 84 and into mold cavity 68 at about 1000 psi.

Figure 2A:
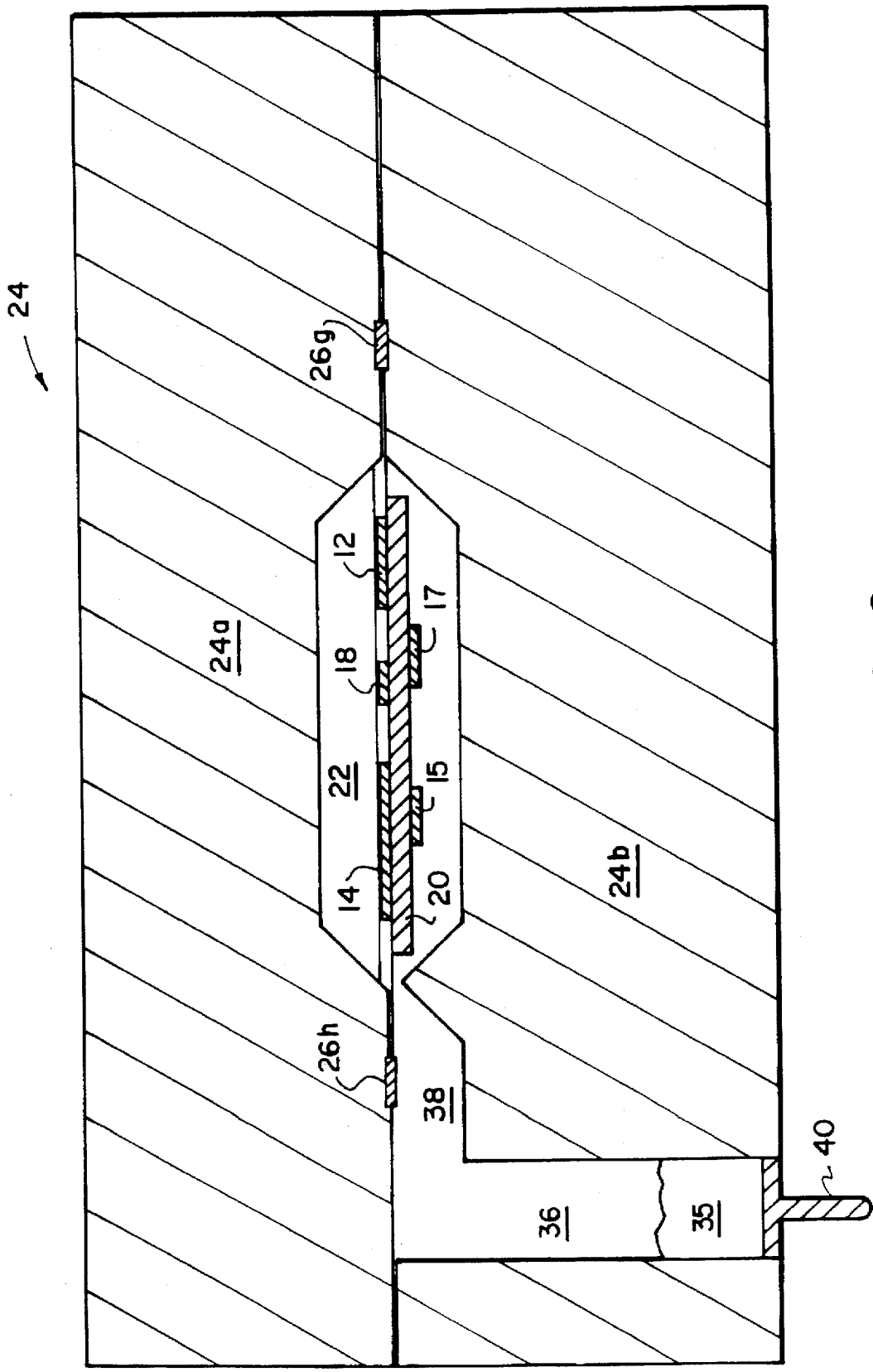
Figure 2B:
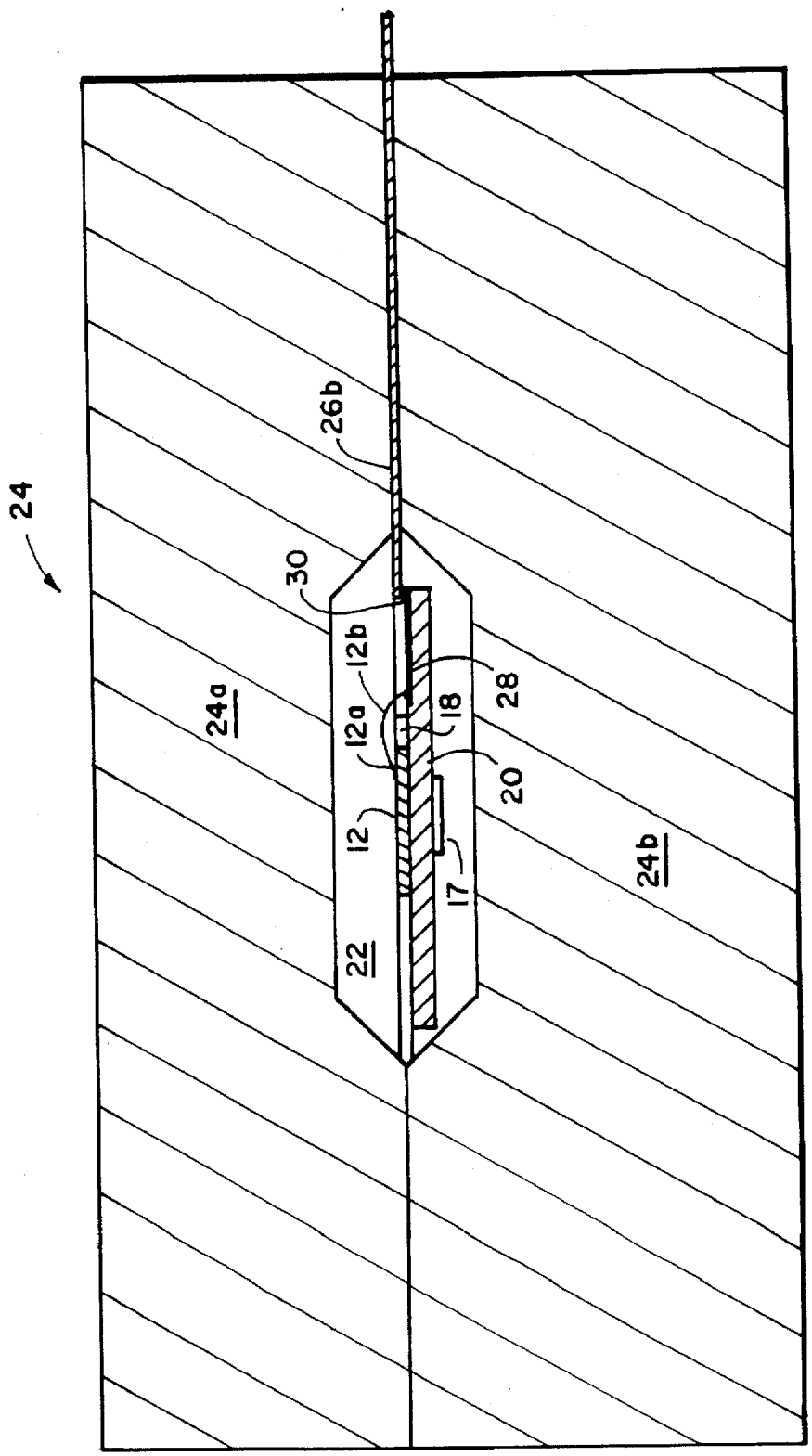
Figure 2C:
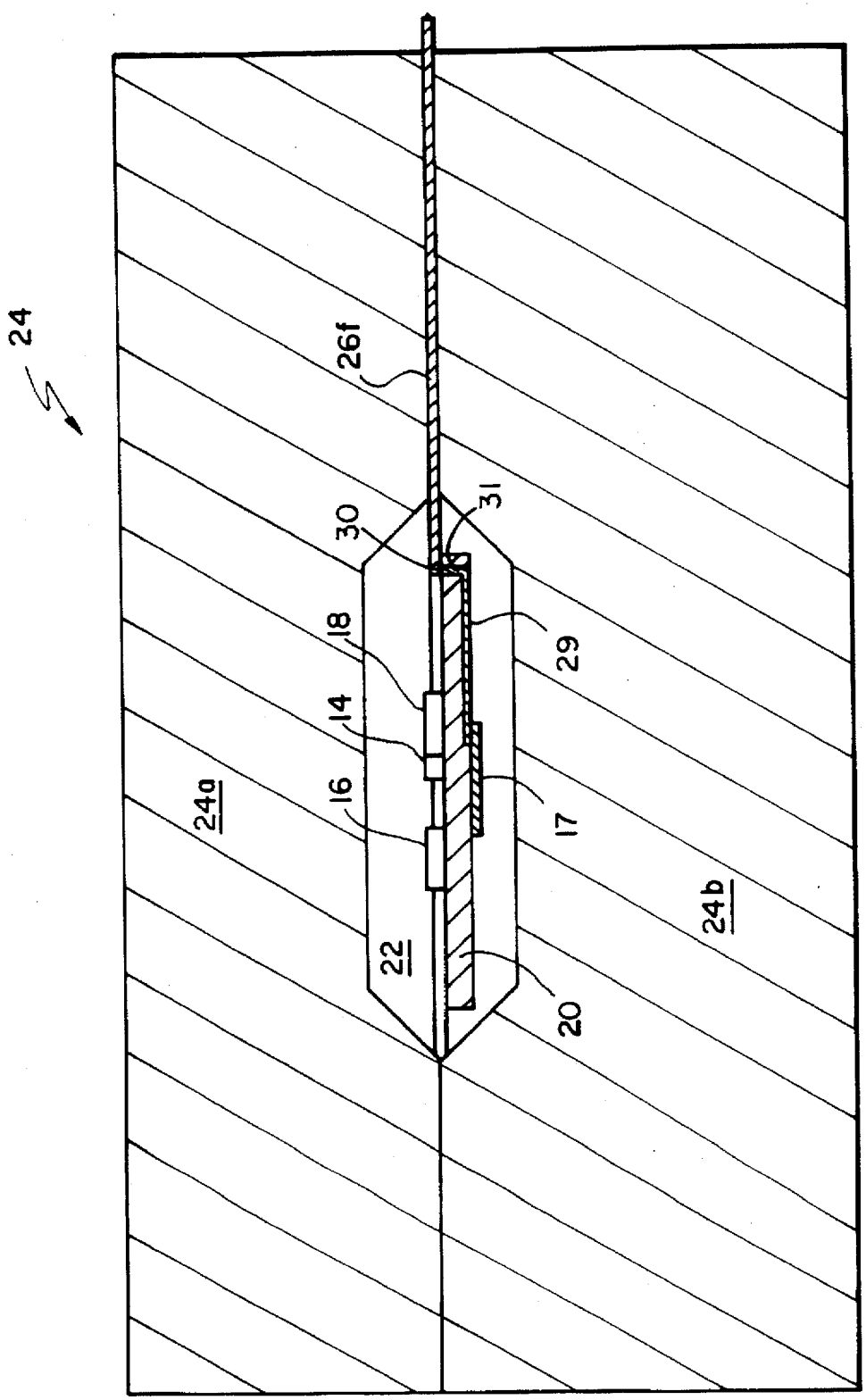
Figure 2D:
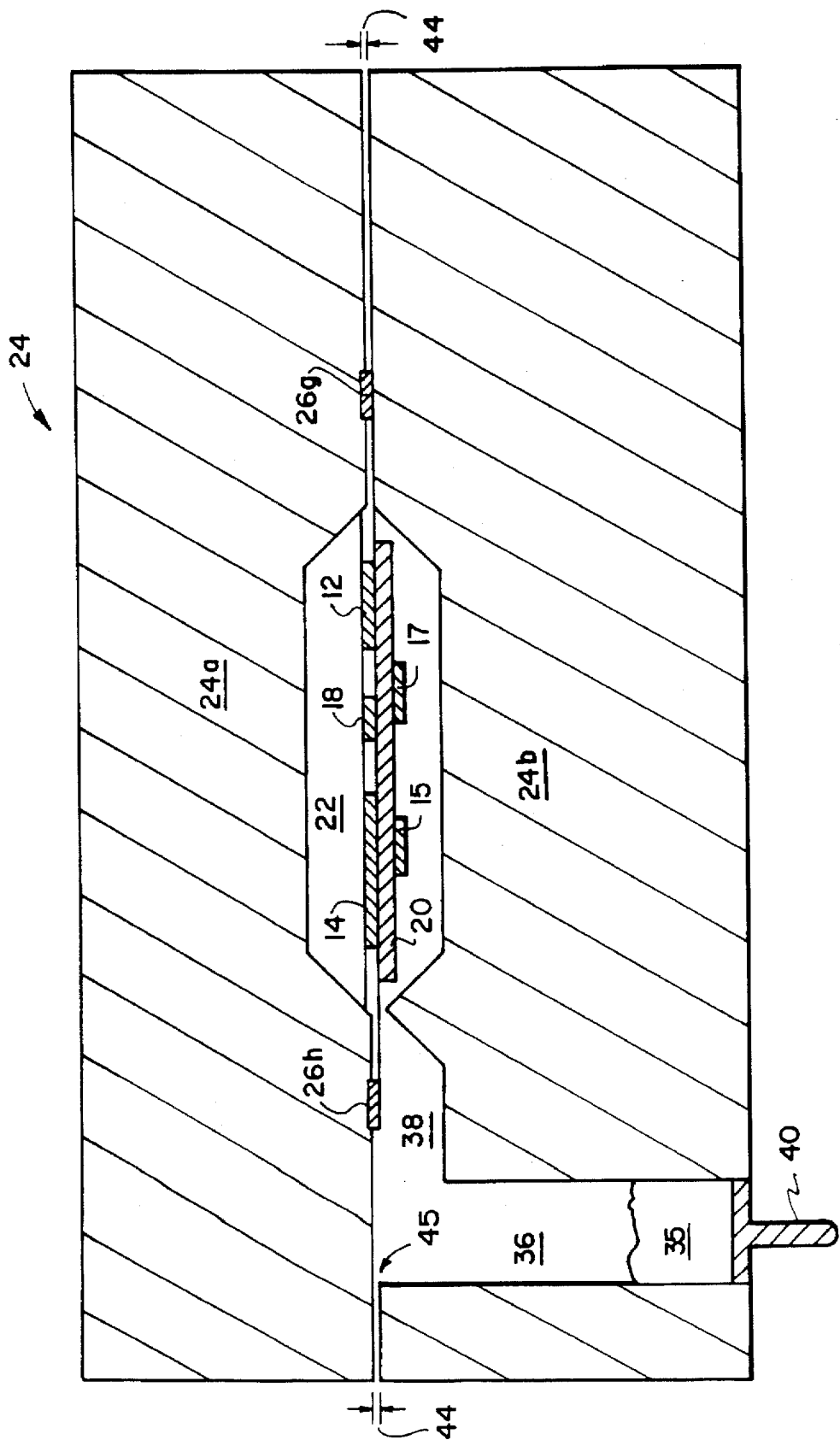
Figure 2E:
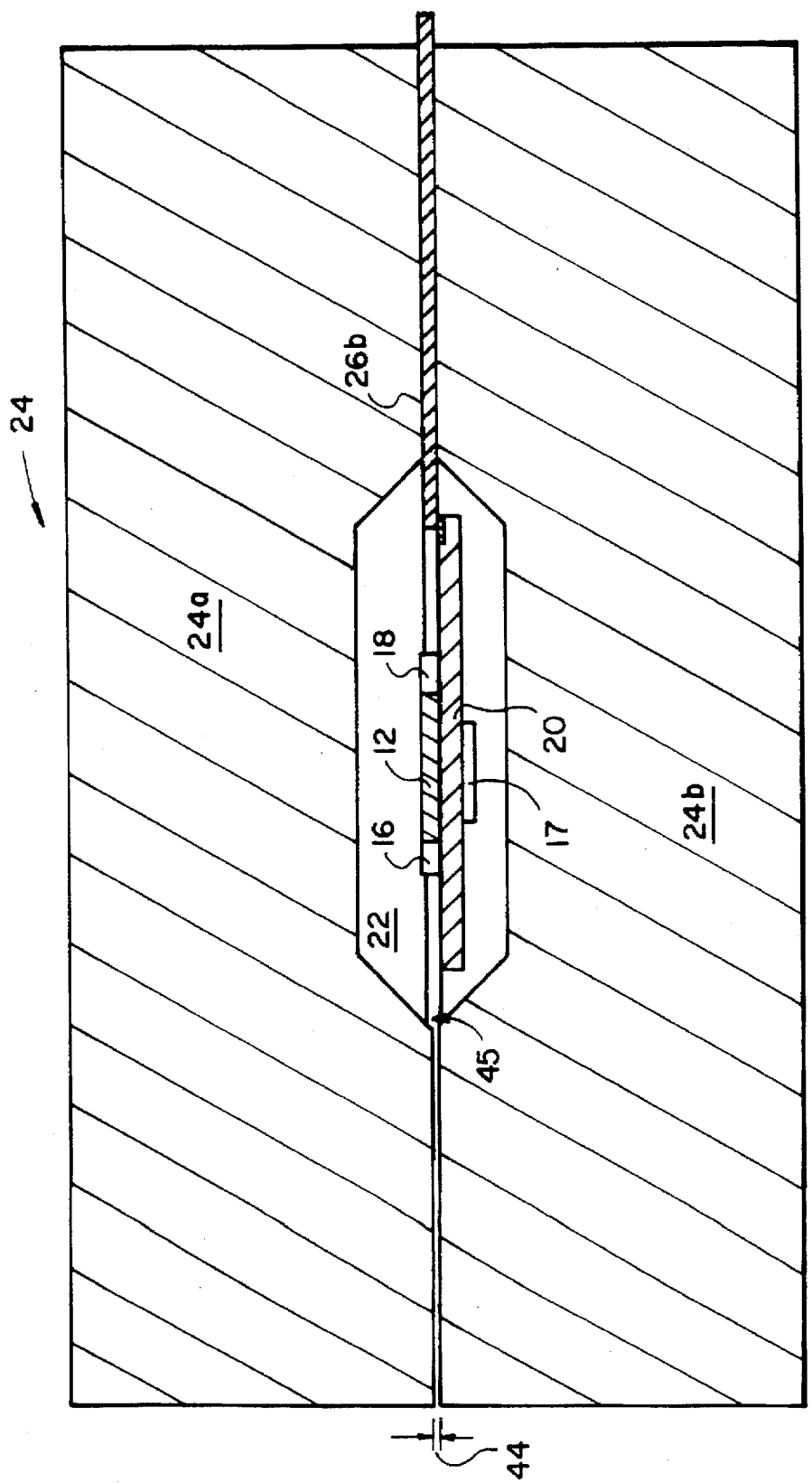
Figure 3A:
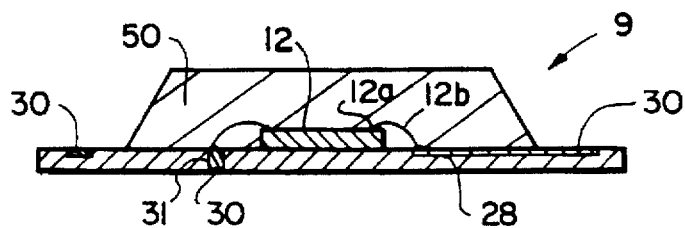
FIG. 3a is a cross-sectional side view of a circuit having a portion of one side of a substrate encapsulated in molding compound.
Figure 3B:
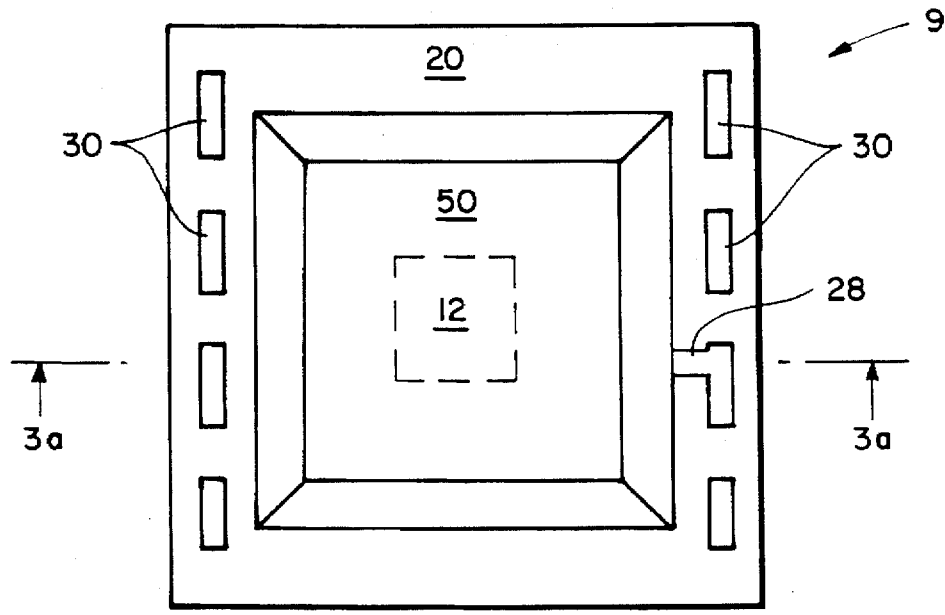
Figure 3C:
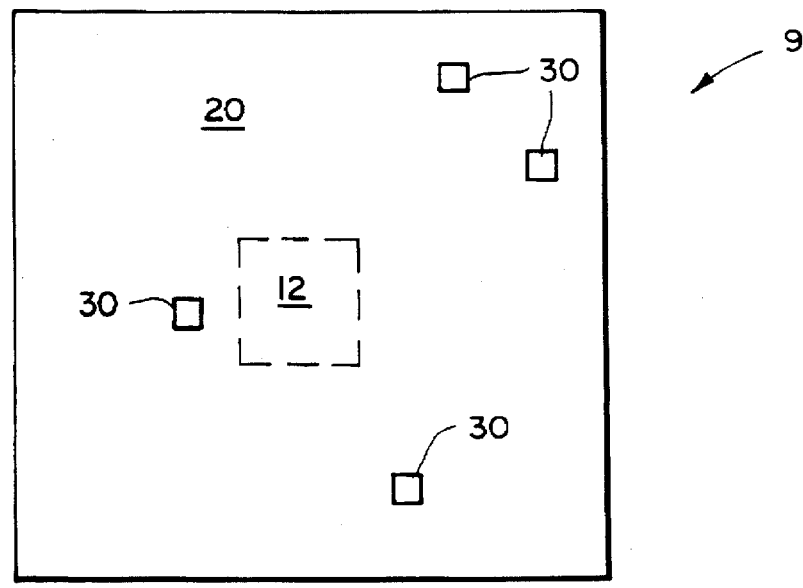

Top 60a and bottom 60b of mold 60 close on printed circuit board on all sides of circuit 10 forming a seal around circuit 10 with the exception of I/O pads 30. A top of pot 86 and runner 84 is defined by PCB waste portion 20b (FIG. 9). As a result, variations in the thickness of the PCB do not cause a gap (gap 44, FIGS. 2d, 2e) through which molding compound 35 can leak.

Ridge 62 of mold top 60a and ridge 78 of mold bottom 60b extend up to a maximum of 0.002 inches into PCB 20 and waste portions 20a, 20b, 20c, and 20d. PCB 20 is compressible, and, in the area of I/O pads 30, PCB 20 is not crushed or otherwise permanently damaged by ridges 62 and 78. Ridges 62 and 78 also prevent molding compound from leaking in the direction indicated by arrows 92 (FIGS. 7, 8a, 8b) and "resin bleeding" (i.e., epoxy resin leakage) which can occur with a gap 44 (FIGS. 2d, 2e) of 0.0005 inches or less.

Mold 60 is part of a press 130, shown in FIG. 11. After PCB 20 is inserted into mold cavity 68, a top 130a of press 130 closes mold top 60a on PCB 20 and the waste portions.

Press top 130a and bottom 130b hold the mold closed while the molding compound 35 is pushed into mold cavity 68.

Press 130 provides an even profile of pressure across PCB 20 (the edges of waste portions 20c are shown) through mold 60. If two molds 60 are inserted into press 130 and the thickness $T_1$, $T_2$ of each PCB is different (i.e., $T_1$ is less than $T_2$), press 130 will not provide an even profile of pressure across the thinner PCB (i.e., $T_1$), as indicated in FIG. 12 by gap 132.

In order to accommodate multiple molds holding PCBs of different thicknesses, a press 134 is provided (FIG. 13a) with springs 136 attached to each mold top 60a. Springs 136 have a spring constant of approximately 100 Kg per 0.001 inch, and the compliance of the springs allows the press to apply an even pressure across each mold 60 even where the molds hold PCBs of different thicknesses. One or more springs may be attached to each mold top 60a, and instead of springs, hydraulic cylinders 150 filled with high pressure fluid 154 and having pistons 152 (FIG. 13b) or pneumatic cylinders 156 filled with high pressure gas 158 and having pistons 160 (FIG. 13c) can be used.

Referring to FIGS. 14 and 15, to stabilize (i.e., prevent movement of) PCB 20 within mold cavity 68 during encapsulation, the mold can be configured to close on a portion (i.e., in between dashed lines 142, 146 of FIG. 15) 140 of PCB 20 in an area of PCB 20 without pads 30. As a result, portion 140 will not be encapsulated in cured molding compound 50, shown in FIGS. 16 and 17. Ridges 62 and 78 can also be configured to close on multiple portions of PCB 20 in areas of PCB 20 without pads 30.

After molding, component 9 is removed from mold 60, and waste portions 20a, 20b, 20c, and 20d (along with waste, cured molding compound, i.e., cull) are removed by cutting along dashed line 94 (FIGS. 6a, 6b). As shown in FIG. 18, exposed conductive pads 30 of component 9 (cured molding compound 50 surrounds circuit 10) are then used to connect circuit 10 into a larger circuit 96 on a PCB 98. Cured molding compound 50 also serves as an electrical insulator providing a high voltage breakdown and, thus, allowing component 9 to be placed in close proximity to other electrical components.

Referring to FIG. 19, several circuits 110, 112, 114 (with similar electrical components 12, 14, 16, and 18 (15 and 17 are included but not shown) connected through similar PCBs 20) can be molded simultaneously. Each circuit has conductive pads 30 through which electrical connections can be made to the components 12, 14, 15, 16, 17, and 18 (only conductive lead 29 is shown for clarity). PCB waste portions 20a, 20b, 20c, 20d, 20e, 20f, 20g, 20h, 20i, and 20j connect the circuits and are cut away along dashed lines 116, after molding, to provide encapsulated circuits with exposed conductive pads 30.

As shown in FIG. 20, mold 120 has a cavity 122 for each circuit. Ridges 124 of mold top 80a surround each circuit, by extending down against waste portions 20b, 20c, 20d, 20e, 20f, 20g, 20h, 20i, and 20j and by extending down against the areas between waste portions 20a, 20d, and 20g and PCB 20, including I/O pads 30. Similarly, ridges 126 of mold bottom 120b surround each circuit by extending up against waste portions 20b, 20c, 20d, 20e, 20f, 20g, 20h, 20i, and 20j and by extending up against the areas between waste portions 20a, 20d, and 20g and PCB 20, including I/O pads 30. As a result, ridges 124 and 126 form a seal around PCBs 20. The bottom side of waste portions 20b, 20f, and 20i define tops of runners and pots indicated by dashed lines 128 in FIG. 19. Molding is accomplished as described above with references to FIGS. 7–10 and 13.

A PCB's thickness can vary as much as 0.002 inches from waste portion 20a to waste portion 20j. Hence, conventionally molding several circuits simultaneously is difficult because although the mold may apply the proper pressure and not form a gap 44 (FIGS. 2d, 2e) at one end of the PCB, it may not apply the proper pressure or form a gap 44 at the opposite end of the PCB. The variation in the thickness of the PCB is accommodated for in mold 120 (FIG. 20) by ridges 62 and 78. In areas where the PCB is thickest, ridges 62 and 78 compress the PCB approximately 0.002 inches. In areas where the PCB is the thinnest, ridges 62 and 78 close against, but do not compress the PCB. As a result, no gap is created through which molding compound can leak out of mold 120.

Other embodiments are within the scope of the following claims. For example, many different circuit shapes can be molded in this way, and the printed circuit boards may have only one area where conductive pads are mounted or multiple areas (FIG. 21) where conductive I/O pads 30 are mounted. The conductive pads may also be mounted on both sides of the PCB (FIG. 22).

Similarly, a variety of compliant and non-compliant substrates can be used instead of PCB 20 and waste portions 20a, 20b, 20c, and 20d, shown in FIGS. 6a, 6b. A non-compliant substrate such as ceramic, for example, could be used. Where non-compliant substrates are used, mold top 60a and mold bottom 60b (FIGS. 7–10) would not include ridges 62, 78, respectively. Instead, surfaces 64 and 80 of mold top 60a and bottom 60b, respectively, would close flush against the non-compliant substrate.

What is claimed is:

1. A method for encapsulating portions of a circuit formed on a substrate having two faces and perimeter sides, comprising inserting the substrate into a mold, closing a top of the mold and a bottom of the mold against the substrate, pushing molding compound from a conduit having a top defined by the substrate into a chamber in the mold, and encapsulating, in the molding compound, a first portion of one of the faces of the substrate and a portion of the sides of the substrate, and, during encapsulation, leaving a second portion of the one face of the substrate unencapsulated, the second portion of the one face bearing conductive pads.

2. The method of claim 1, further comprising encapsulating a portion of the other of the faces of the substrate.

3. The method of claim 2, further comprising leaving a second portion of the other of the faces of the substrate unencapsulated.

4. The method of claim 3, wherein the second portion of the other of the faces bears conductive pads.

5. The method of claim 1, wherein the conductive pads are electrically connected to electronic components, the electronic components being mounted on the substrate and encapsulated in the molding compound.

6. A method for encapsulating portions of a circuit formed on a substrate having two faces and perimeter sides, comprising inserting the substrate into a mold, the substrate including an active portion on which the conductive pads and electronic components electrically connected to the conductive pads, are mounted, and a waste portion connected to the active portion by a segment in the area of the conductive pads, closing a top of the mold and a bottom of the mold against the waste portion and against the segment of the active portion in the area of the conductive pads, pushing molding compound from a conduit, having a top defined by the waste portion into a chamber in the mold, and encapsulating, in the molding compound, a first portion of one of the faces of the substrate and a portion of the sides of the substrate, and, during encapsulation, leaving a second portion of the one face of the substrate unencapsulated, the second portion of the one face bearing conductive pads.

7. The method of claim 6, wherein the segment includes segments.

8. The method of claim 6, wherein closing the mold comprises causing a ridge on the top of the mold to extend down against the waste portion and the segment of the active portion in the area of the conductive pads, and causing a first ridge on the bottom of the mold to press up against the waste portion and the segment including the conductive pads.

9. The method of claim 8, further comprising defining an end of the conduit with a second ridge on the bottom of the mold.

10. The method of claim 8, further comprising causing the top of the mold to extend down against a second segment of the active portion, and causing the bottom of the mold to press up against the second segment.

11. The method of claim 10, wherein the second segment includes segments.

12. The method of claim 10, further comprising defining an end of the conduit with a second ridge on the bottom of the mold.

13. The method of claim 1, wherein the top of the mold and the bottom of the mold are separated by the substrate.

14. The method of claim 1, wherein the mold is connected to a compliance mechanism of a press, the press provides an even pressure distribution across the substrate through the compliance mechanism.

15. The method of claim 14, wherein the press includes molds and a compliance mechanism for attachment to each of the molds to enable the press to provide an even pressure distribution across substrates inserted in the molds.

16. The method of claim 14, wherein the compliance mechanism comprises a spring.

17. The method of claim 14, wherein the compliance mechanism comprises a pneumatic cylinder.

18. The method of claim 14, wherein the compliance mechanism comprises a hydraulic cylinder.

19. The method of claim 1, further comprising curing the molding compound, removing the substrate with exposed conductive pads from the mold, and cutting away the waste portion and waste molding compound.

20. The method of claim 1, wherein the conduit includes a pot and a runner.

21. The method of claim 20, wherein the pot and the runner are in the bottom of the mold.

22. A method for encapsulating a circuit, comprising inserting a substrate into a mold, wherein the substrate includes an active portion bearing electronic components and conductive pads for connecting to the components and a waste portion connected to the active portion by a segment in the area of the conductive pads, closing the mold causing a ridge on a top of the mold to extend down against the waste portion and the segment including the conductive pads and causing a first ridge on a bottom of the mold to press up against the waste portion and the segment including the conductive pads, pushing molding compound from a conduit having a top defined by the waste portion and an end defined by a second ridge on the bottom of the mold, into a mold cavity to encapsulate a portion of the active area, leaving the conductive pads exposed.

23. A method for encapsulating circuits, comprising inserting a substrate into a mold, wherein the substrate includes active portions bearing electronic components and conductive pads for connecting to the components and waste portions connected to the active portions by segments in the areas of the conductive pads, closing the mold causing ridges on a top of the mold to extend down against the waste portions and the segments including the conductive pads and causing first ridges on a bottom of the mold to press up against the waste portions and the segments including the conductive pads, pushing molding compound from conduits having tops defined by the waste portions and ends defined by second ridges on the bottom of the mold, into mold cavities to encapsulate portions of the active areas, leaving the conductive pads exposed.

24. The method of claim 23, wherein the mold is connected to a compliance mechanism of a press, the press provides an even pressure distribution across the substrate through the compliance mechanism.

25. A method for encapsulating portions of a circuit formed on a substrate, comprising inserting the substrate into a mold, the substrate including an active portion on which conductive pads and electronic components electrically connected to the conductive pads are mounted and a waste portion connected to the active portion by a segment in the vicinity of the conductive pads, closing a top of the mold and a bottom of the mold against the waste portion and against the segment of the active portion in the vicinity of the conductive pads, and pushing molding compound from a conduit, having a top defined by the waste portion, into a chamber in the mold.

* * * * *

UNITED STATES PATENT AND TRADEMARK OFFICE
CERTIFICATE OF CORRECTION

PATENT NO.    : 5,728,600
DATED         : MARCH 17, 1998
INVENTOR(S)   : SAXELBY, JR. ET AL.

It is certified that error appears in the above-identified patent and that said Letters Patent is hereby corrected as shown below:

Column 6, line 9, change "62 and 78" to --124 and 126--.

Column 6, line 10, change "62 and 78" to --124 and 126--.

Column 6, line 11, change "62 and 78" to --124 and 126--.

Signed and Sealed this

Twenty-seventh Day of March, 2001

Attest:

NICHOLAS P. GODICI

*Attesting Officer*    Acting Director of the United States Patent and Trademark Office